(12) United States Patent
Lee et al.

(10) Patent No.: US 10,777,278 B2
(45) Date of Patent: Sep. 15, 2020

(54) NON-VOLATILE MEMORY DEVICE AND ERASING METHOD OF THE SAME

(71) Applicant: Samsung Electronics Co., Ltd., Suwon-si, Gyeonggi-do (KR)

(72) Inventors: Ji-Young Lee, Suwon-si (KR); Young-sik Rho, Changwon-si (KR); Il-han Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/401,877

(22) Filed: May 2, 2019

(65) Prior Publication Data
US 2019/0378574 A1 Dec. 12, 2019

(30) Foreign Application Priority Data
Jun. 8, 2018 (KR) .......................... 10-2018-0066091

(51) Int. Cl.
| | |
|---|---|
| *G11C 16/04* | (2006.01) |
| *G11C 16/14* | (2006.01) |
| *G11C 16/10* | (2006.01) |
| *G11C 16/34* | (2006.01) |

(52) U.S. Cl.
CPC .......... *G11C 16/14* (2013.01); *G11C 16/0483* (2013.01); *G11C 16/10* (2013.01); *G11C 16/3445* (2013.01); *G11C 16/3495* (2013.01)

(58) Field of Classification Search
CPC ..... G11C 16/14; G11C 16/0483; G11C 16/10; G11C 16/3445; G11C 16/3495
See application file for complete search history.

(56) References Cited

U.S. PATENT DOCUMENTS

| | | | |
|---|---|---|---|
| 7,403,429 B2 * | 7/2008 | Chae ...................... | G11C 16/16 365/185.24 |
| 7,679,133 B2 | 3/2010 | Son et al. | |
| 8,488,381 B2 | 7/2013 | Kim et al. | |
| 8,488,382 B1 | 7/2013 | Li et al. | |
| 8,537,615 B2 * | 9/2013 | Maeda ................... | G11C 16/26 365/185.11 |

(Continued)

OTHER PUBLICATIONS

Extended European Search Report dated Oct. 23, 2019 for European Patent Application No. 19177925.5.

*Primary Examiner* — Pho M Luu
(74) *Attorney, Agent, or Firm* — Harness, Dickey and Pierce, P.L.C.

(57) ABSTRACT

Provided are a non-volatile memory device and an erasing method thereof. The erasing method of the non-volatile memory device including a plurality of cell strings in which memory cells and selection transistors are connected, includes: performing a first erase operation based on an erase voltage provided to a first electrode of at least one of the selection transistors and an erase control voltage provided to a second electrode of the at least one of the selection transistors; determining whether there are slow erase cells by performing a multiple erase verify operation based on first and second verify voltages, the second verify voltage being higher than the first verify voltage; adjusting, when there are slow erase cells, the erase control voltage such that a voltage difference between the erase voltage and the erase control voltage increases; and performing a second erase operation based on the adjusted erase control voltage.

20 Claims, 19 Drawing Sheets

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 8,873,293 B1 | 10/2014 | Ou et al. |
| 8,885,412 B2 | 11/2014 | Li et al. |
| 8,929,149 B2 | 1/2015 | Shim |
| 8,976,602 B2 | 3/2015 | Shiga et al. |
| 9,019,775 B2 | 4/2015 | Costa et al. |
| 9,171,637 B2 * | 10/2015 | Shimura ............ G11C 16/3459 |
| 9,214,240 B2 | 12/2015 | Dutta et al. |
| 9,449,698 B1 | 9/2016 | Paudel et al. |
| 9,466,387 B2 * | 10/2016 | Nam ...................... G11C 16/12 |
| 2011/0233648 A1 | 9/2011 | Seol et al. |
| 2013/0279256 A1 | 10/2013 | Costa et al. |
| 2014/0334232 A1 | 11/2014 | Nam et al. |
| 2017/0372789 A1 | 12/2017 | Ray et al. |

\* cited by examiner

| ERASE BIAS for BLK | |
|---|---|
| BL | Vers |
| SSL | Vgidl |
| WL | Vwe (GND) |
| GSL | Vgidl |
| CSL | Vers |

| ERASE BIAS for BLK | |
|---|---|
| BL | Vers |
| SSL | Vgidl (< Vers) |
| WL | Vwe (GND) |
| GSL | FLOAT |
| CSL | FLOAT |

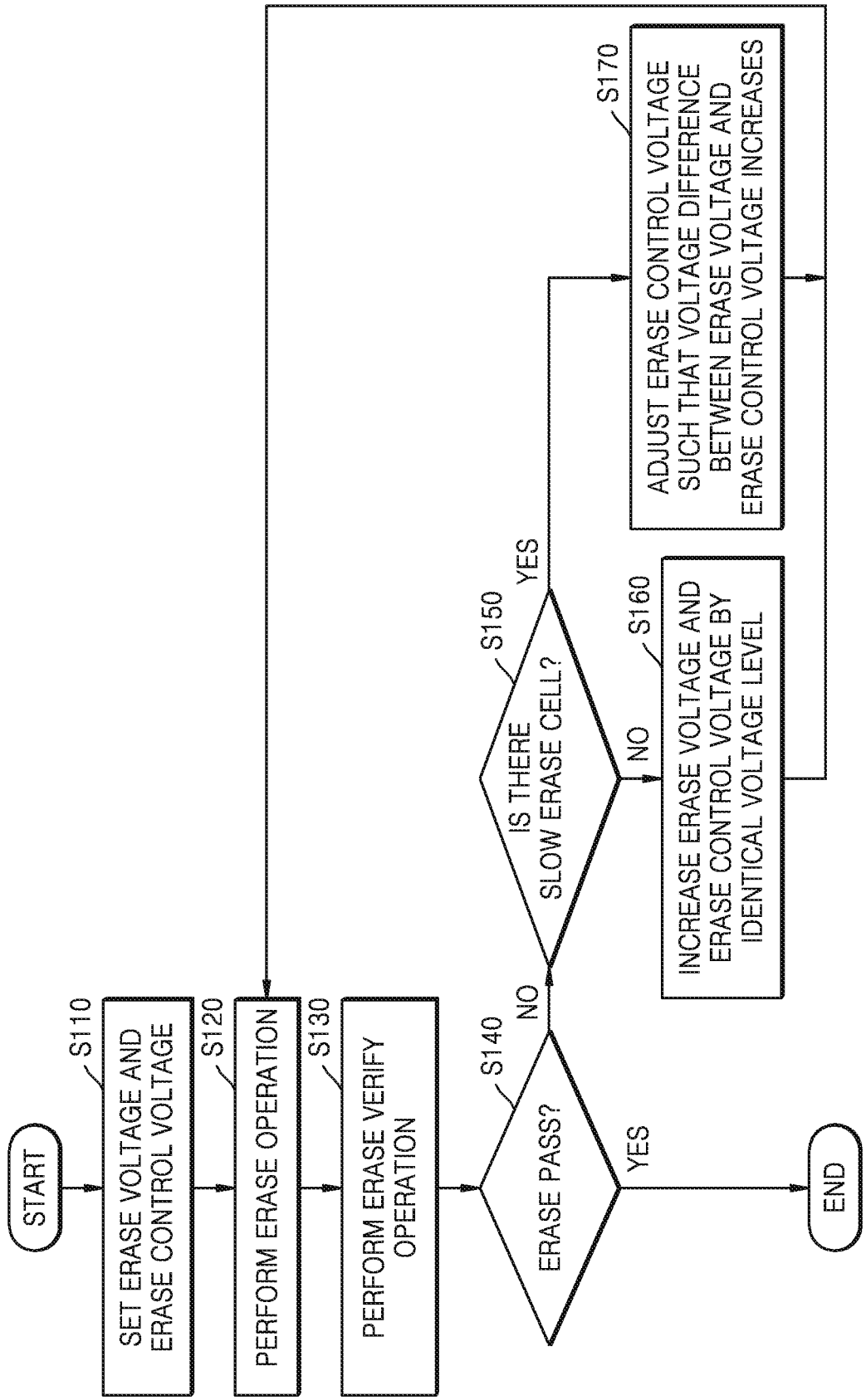

FIG. 18

|  | LOOP_N | | LOOP_N+1 | | LOOP_N+2 | |
|---|---|---|---|---|---|---|
|  | ERASE (Vers1, Vgidl1, Vers1−Vgidl1=Δ1) | VERIFY | ERASE (Vers2, Vgidl2, Vers2−Vgidl2=Δ2, Δ2 = Δ1) | VERIFY | ERASE (Vers2, Vgidl3, Vers2−Vgidl3=Δ3, Δ3 > Δ2) | VERIFY |
| SSL0 | ERASE | Fail | ERASE | Pass | ERASE Inhibit | − |
| SSL1 | ERASE | Fail | ERASE | Fail | ERASE | Pass or Fail |
| ... | ... | ... | ... | ... | ... | ... |
| SSLn−1 | ERASE | Fail | ERASE | Fail | ERASE | Pass or Fail |
| SSLn | ERASE | Fail | ERASE | Pass | ERASE Inhibit | − |

NON-VOLATILE MEMORY DEVICE AND ERASING METHOD OF THE SAME

CROSS-REFERENCE TO RELATED APPLICATION

This application claims the benefit of Korean Patent Application No. 10-2018-0066091, filed on Jun. 8, 2018, in the Korean Intellectual Property Office, the disclosure of which is incorporated herein in its entirety by reference.

BACKGROUND

Example embodiments of the inventive concepts relate to a memory device and a method of operating same. For example, at least some example embodiments relate to a non-volatile memory device and/or an erasing method of the non-volatile memory device.

A memory device is used to store data and may be classified into either a volatile memory device and a non-volatile memory device. A flash memory device, an example of a non-volatile memory device, may be used in mobile phones, digital cameras, portable digital assistants (PDA), mobile computing devices, fixed-type computing devices, or other devices. Recently, demand for higher capacity and higher integration degree of memory devices has risen in accordance with multi-functions of information communication devices.

SUMMARY

Example embodiments of the inventive concepts provide a non-volatile memory device capable of reducing (or, alternatively, preventing) deterioration of the reliability of memory cells and/or an erasing method of the non-volatile memory device.

According to an example embodiment of the inventive concepts, there is provided a method of erasing a non-volatile memory device, the non-volatile memory device including a plurality of cell strings having a plurality of memory cells and selection transistors connected together. In some example embodiments, the method includes performing a first erase operation based on an erase voltage and an erase control voltage, the erase voltage being applied to a first electrode of at least one of the selection transistors and the erase control voltage being applied to a second electrode of the at least one of the selection transistors; determining whether there are slow erase cells among the plurality of memory cells by performing a multiple erase verify operation based on a first verify voltage and a second verify voltage, the second verify voltage being higher than the first verify voltage; adjusting, in response to determining that the slow erase cells are present, the erase control voltage to generate an adjusted erase control voltage such that a voltage difference between the erase voltage and the adjusted erase control voltage is greater than a voltage difference between the erase voltage and the erase control voltage; and performing a second erase operation based on the adjusted erase control voltage.

According to another example embodiment of the inventive concepts, there is provided a method of erasing a non-volatile memory device, the non-volatile memory device including a plurality of cell strings having memory cells and selection transistors connected together. In some example embodiments, the method includes performing a first erase operation based on an erase voltage and an erase control voltage, the erase voltage being applied to a first electrode of at least one of the selection transistors and the erase control voltage being applied to a second electrode of the at least one of the selection transistors; detecting whether each of the plurality of cell strings are erase-passed or erase-failed by performing an erase verify operation based on a verify voltage; adjusting the erase control voltage to generate an adjusted erase control voltage such that, when at least some of the plurality of cell strings are erase-passed, a voltage difference between the erase voltage and the adjusted erase control voltage is greater than a voltage difference between the erase voltage and the erase control voltage; and performing a second erase operation based on the adjusted erase control voltage.

According to another example embodiment of the inventive concepts, there is provided a non-volatile memory device including: a memory block including a plurality of cell strings, each cell string including memory cells and a selection transistor stacked in a direction perpendicular to a substrate, the selection transistor including a first electrode and a second electrode; and control logic configured to, determine whether slow erase cells are present among the memory cells based on a result of verification according to multiple sensing based on a first verify voltage and a second verify voltage when performing an erase-verify iteration on the memory block, and adjust, in response to determining that the slow erase cells are present, an erase control voltage to generate an adjusted erase control voltage such that a voltage difference between an erase voltage provided to the first electrode and the adjusted erase control voltage provided to the second electrode is greater than a voltage difference between the erase voltage and the erase control voltage.

BRIEF DESCRIPTION OF THE DRAWINGS

Example embodiments of the inventive concepts will be more clearly understood from the following detailed description taken in conjunction with the accompanying drawings in which:

FIG. 6 is a flowchart of an erasing method of a memory device according to an example embodiment of the inventive concepts;

FIG. 18 is a diagram illustrating an example of the erasing method of a memory device of FIG. 17;

DETAILED DESCRIPTION

Example embodiments of the inventive concepts will now be described below with reference to the accompanying drawings. While such terms as "first," "second," etc., may be used to describe various elements, such elements must not be limited to the above terms. The above terms are used only to distinguish one element from another, and do not define corresponding elements, for example, an order and/or significance of the elements. Without departing a scope of rights of the specification, a first element may be referred to as a second element, and similarly, the second element may be referred to as the first element. As used herein, the term "and/or" includes any and all combinations of one or more of the associated listed items.

Figure 1:
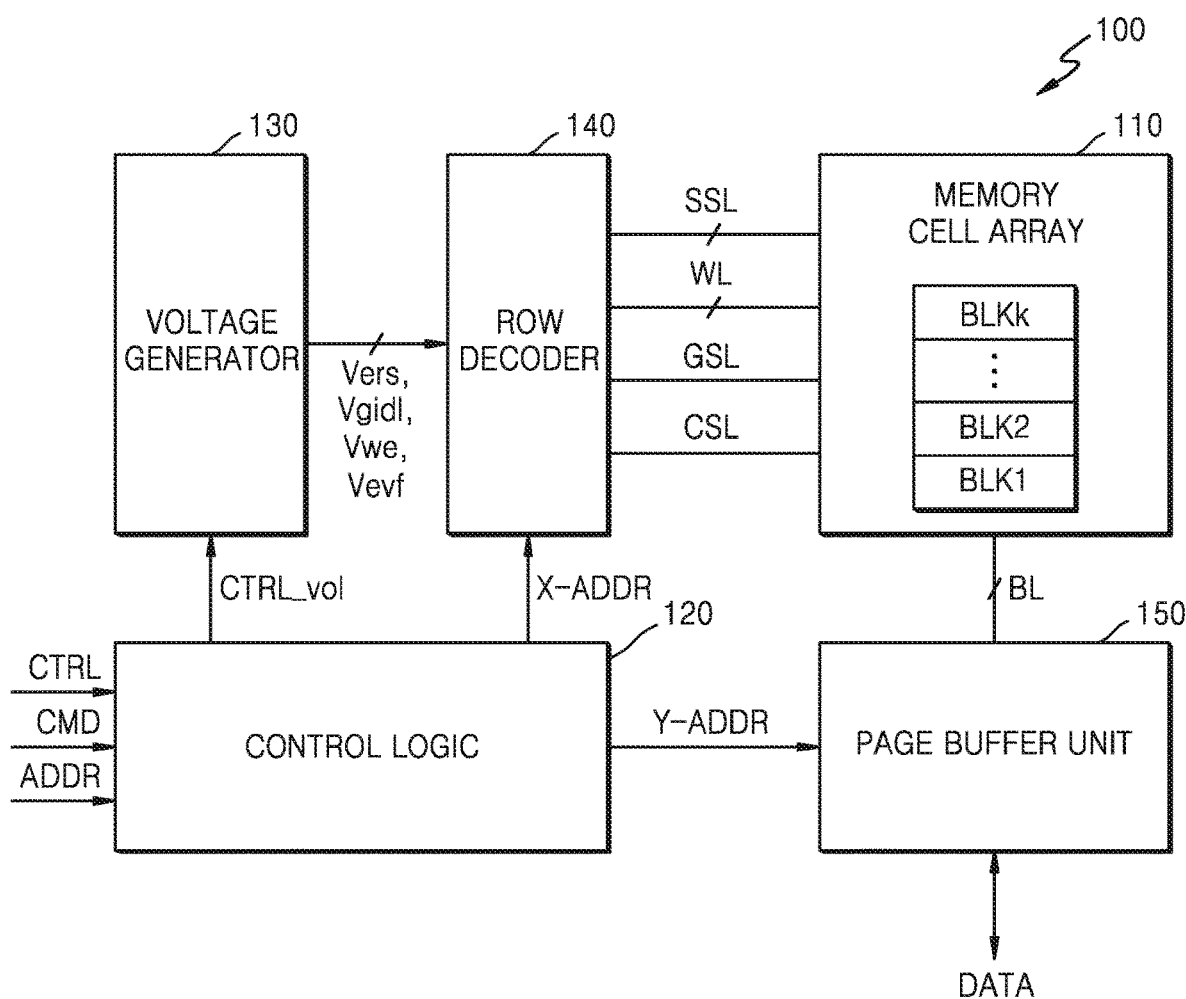
FIG. 1 is a block diagram illustrating a memory device according to an example embodiment of the inventive concepts.

FIG. 1 is a block diagram illustrating a memory device 100 according to an example embodiment of the inventive concepts.

Referring to FIG. 1, the memory device 100 may include a memory cell array 110, a control logic 120, a voltage generator 130, a row decoder 140, and a page buffer unit 150. While not illustrated in FIG. 1, the memory device 100 may further include, for example, a data input/output circuit or an input/output interface. The memory device 100 may be a non-volatile memory device.

The memory cell array 110 may be connected to the row decoder 140 through word lines WL, string selection lines SSL, and ground selection lines GSL and may be connected to the page buffer unit 150 through bit lines BL. The memory cell array 110 may include a plurality of memory cells, and for example, the plurality of memory cells may be flash memory cells. Hereinafter, example embodiments of the inventive concepts will be described in detail, in which NAND flash memory cells are included as an example of a plurality of memory cells. However, example embodiments of the inventive concepts are not limited thereto, and the plurality of memory cells may be various kinds of non-volatile memory cells. In an example embodiment, the plurality of memory cells may be resistive memory cells such as resistive random access memory (RRAM) memory cells, phase change RAM (PRAM) memory cells, or magnetic RAM (MRAM) memory cells.

The memory cell array 110 may include a plurality of memory blocks BLK1 through BLKk, and each of the memory blocks BLK1 through BLKk may be implemented as a three-dimensional (3D) memory array.

A 3D memory cell array may be monolithically formed in at least one physical level of memory cell arrays having an active area provided above a silicon substrate and circuitry associated with the operation of memory cells, wherein such associated circuitry may be above or within the silicon substrate. The term "monolithic" means that layers of each level of the 3D memory cell array are directly deposited on the layers of each underlying level of the 3D memory cell array.

The 3D memory cell array may include cell strings in which at least one memory cell is located on another memory cell in a vertical direction. The at least one memory cell may include a charge trap layer. The following patent documents, which are hereby incorporated by reference, disclose suitable configurations for 3D memory cell arrays, in which the 3D memory cell array is configured at a plurality of levels, with word lines and/or bit lines shared between levels: U.S. Pat. Nos. 7,679,133; 8,553,466; 8,654,587; 8,559,235; and U.S. Pat. Pub. No. 2011/0233648. In addition, U.S. Pat. No. 2014/0334232 and U.S. Pat. No. 8,488,381 are hereby incorporated by reference.

The memory cell array 110 may include at least one of a single-level cell block including single-level cells, a multi-level cell block including multi-level cells, and a triple-level cell block including triple-level cells. In other words, some of a plurality of memory blocks included in the memory cell array 110 may be single-level cell blocks, and other memory blocks may be multi-level cell blocks or triple-level cell blocks.

In response to a row address X-ADDR received from the control logic 120, the row decoder 140 may select at least one of the plurality of memory blocks BLK1 to BLKk and select one of word lines WL of a selected memory block.

The page buffer unit 150 may select some of the bit lines BL in response to a column address Y-ADDR. In detail, the page buffer unit 150 operates as a write driver or a sense amplifier according to an operating mode. During a read operation, the page buffer unit 150 may operate as a sense amplifier and sense data DATA stored in the memory cell array 110. During a program operation, the page buffer unit 150 may operate as a write driver and input data DATA to be stored in the memory cell array 110.

The control logic 120 may program data to the memory cell array 110, read data from the memory cell array 110 or output various control signals for erasing data stored in the memory cell array 110, for example, a voltage control signal CTRL_vol, a row address X-ADDR, and a column address Y-ADDR. Thus, the control logic 120 may generally control various internal operations of the memory device 100. However, the inventive concepts are not limited thereto, and the control logic 120 may further provide other control signals to the voltage generator 130, the row decoder 140, and the page buffer unit 150.

The voltage generator 130 may generate various kinds of voltages for performing a program operation, a read operation, and an erase operation on the memory cell array 110, based on a voltage control signal CTRL_vol. For example, the voltage generator 130 may generate a program voltage (or a write voltage), a read voltage, a program inhibit voltage, a read inhibit voltage, a verify voltage or a program verify voltage, or the like, which are provided to word lines WL. Also, the voltage generator 130 may generate voltages provided to string selection lines SSL and ground selection lines GSL according to operations of the memory device 100 based on a voltage control signal CTRL_vol. According to an example embodiment, when performing an erase operation and an erase verify operation, the voltage generator 130 may generate bias voltages, for example, an erase voltage Vers, an erase control voltage Vgidl, a word line erase voltage Vwe, or a verify voltage Vevf.

As voltages generated in the voltage generator 130 are provided to the plurality of memory blocks BLK1 through BLKk through the row decoder 140, a write operation, a read operation, an erase operation, and/or a verify operation (e.g., program verification, erase verification, and the like) may be performed on the plurality of memory blocks BLK1 to BLKk included in the memory cell array 110.

In regards to the erasing operation, erasing may be performed on each memory block, and as an erase loop in which an erase operation and an erase verify operation are performed is repeated, the erasing of a memory block may be completed. An erase loop may be repeatedly performed with respect to each memory block or each cell string of memory blocks.

The control logic 120 may provide the voltage generator 130 with a signal indicating voltages to provide to a memory block in a next erase loop based on a result of an erase verification of each erase loop, that is, a voltage control signal CTRL_vol for setting a level of bias voltages used in an erase operation, and the voltage generator 130 may generate erasing bias voltages based on the voltage control signal CTRL_vol. Accordingly, the control logic 120 may adjust a level of erasing bias voltages provided to a memory block when an erase operation is performed in a next loop, based on the result of the erase verification. For example, the control logic 120 may control an erase voltage Vers to increase in a next loop.

Meanwhile, the memory device 100 according to example embodiments of the inventive concepts may perform an erase operation according to a Gate Induced Drain Leakage (GIDL) erasing method. According to the GIDL erasing method, an erase voltage Vers which is a high voltage may be applied to a drain electrode (or a source electrode) of a GIDL transistor (for example, a ground selection transistor and/or a string selection transistor) located at two ends of cell strings (for example, cell strings NS11 through NS33 of FIGS. 2A and 2B), and an erase control voltage Vgidl having a lower level than the erase voltage Vers may be applied to a gate electrode of the GIDL transistor. When a voltage difference between the drain electrode and the gate electrode of the GIDL transistor is equal to or greater than a voltage level at which a GIDL current (for example, a leakage current) may occur (hereinafter referred to as a GIDL voltage level), holes according to the GIDL current may be injected into a channel region of a cell string, thereby charging the channel region.

The control logic 120 may adjust levels of the erase voltage Vers and the erase control voltage Vgidl provided to the GIDL transistor in an erase operation of a next loop based on a result of erase verification. In an example embodiment, the control logic 120 may determine whether there are slow erase cells based on the result of the erase verification, and may differentiate a method of adjusting the erase voltage Vers and the erase control voltage Vgidl based on whether there slow erase cells or not.

When there is a slow erase cell, the erase control voltage Vgidl may be adjusted such that a voltage difference between the drain electrode and the gate electrode of the GIDL transistor increases. The control logic 120 may adjust both the erase voltage Vers and the erase control voltage Vgidl such that a voltage difference between the drain electrode and the gate electrode of the GIDL transistor increases.

When there is no slow erase cell, the control logic 120 may increase the erase voltage Vers and may increase the erase control voltage Vgidl by an increment of the erase voltage Vers such that a voltage difference between the drain electrode and the gate electrode of the GIDL transistor remains the same as that of a previous loop.

In an example embodiment, the control logic 120 may determine whether there is a slow erase cell is present through multiple verifications. In an example embodiment, the control logic 120 may determine whether there is a slow erase cell based on an erase pass or erase fail of cell strings. The control logic 120 also determines whether there is a slow erase cell based on information previously stored in a storage region of the memory device 100 (e.g., the memory cell array 110, a register, a one-time programmable (OTP) memory, etc.).

According to the erasing method according to various example embodiments of the inventive concepts, a method of performing erase verify and adjusting erasing bias voltages, that is, the erase voltage Vers and the erase control voltage Vgidl, will be described in more detail with reference to FIGS. 4A to 20.

Figure 2A:
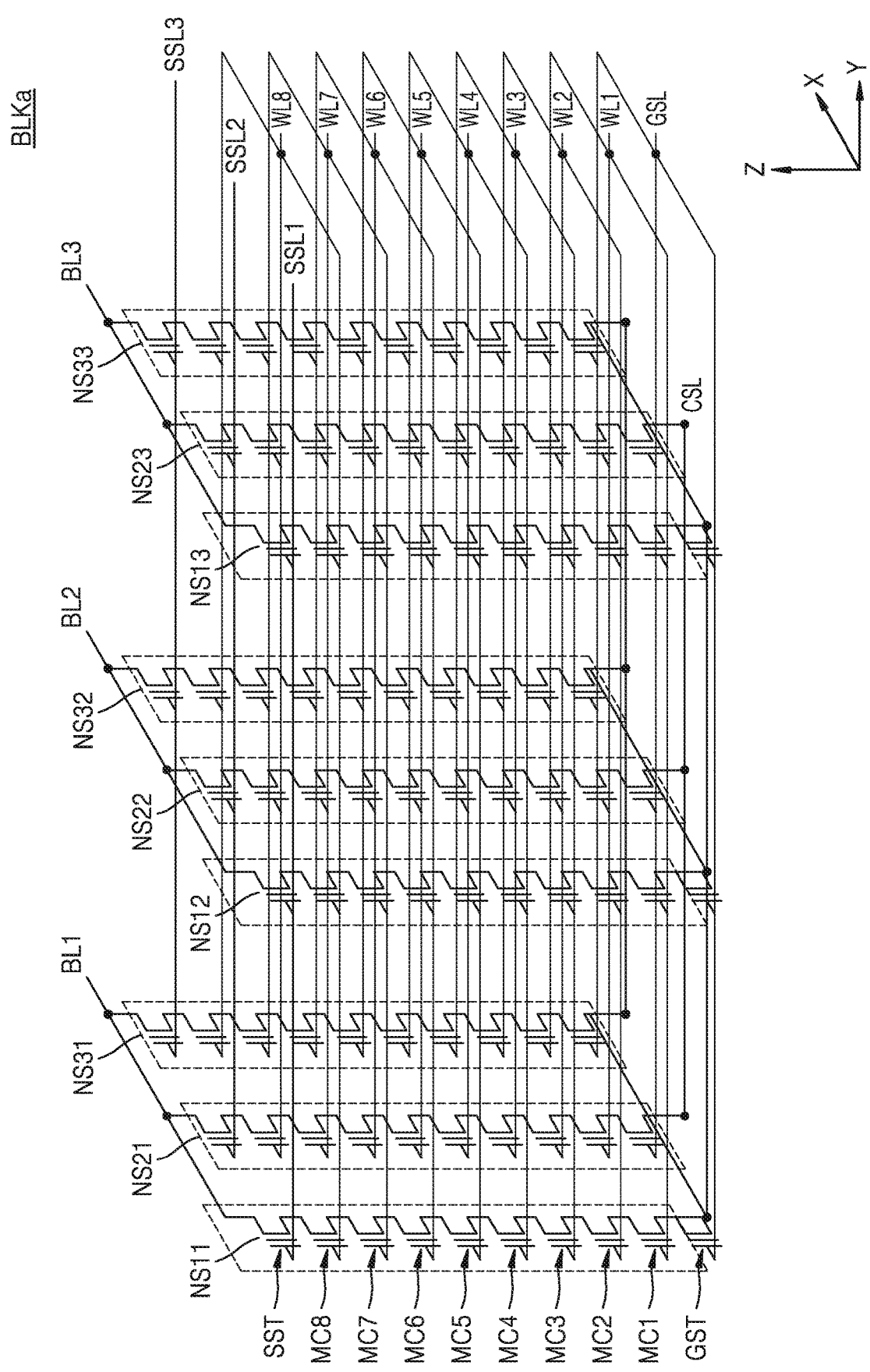
FIGS. 2A and 2B are circuit diagrams illustrating an example of an equivalent circuit of a memory block of FIG. 1.
Figure 2B:
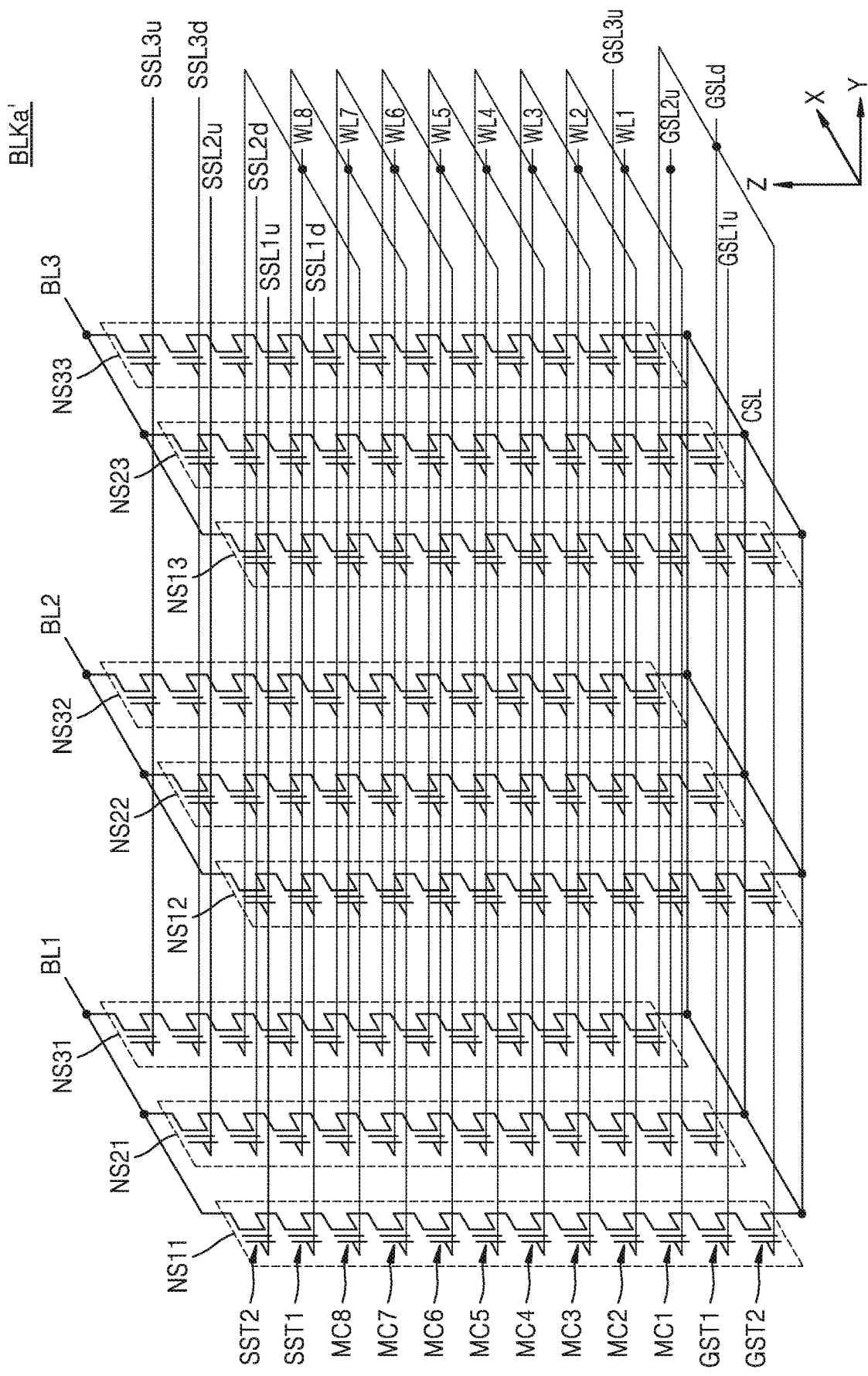

FIGS. 2A and 2B are circuit diagrams illustrating equivalent circuits of memory blocks BLKa and BLKa' according to example embodiments of the inventive concepts.

Referring to FIGS. 2A and 2B, the memory blocks BLKa and BLKa' shown in FIGS. 2A and 2B may be implemented as a vertical NAND flash memory array and may be applied to at least one of the memory blocks BLK1 to BLKk of the memory device 100 of FIG. 1. However, the inventive concepts are not limited thereto, and a 3D memory array implemented in a same or similar manner as memory blocks described with reference to FIGS. 2A and 2B may be applied to at least one of the memory blocks BLK1 to BLKk of FIG. 1.

Referring to FIG. 2A, the memory block BLKa includes a plurality of cell strings NS11 through NS33 formed in a vertical direction (Z-direction) and may include a plurality of cell strings NS11 through NS33, a plurality of bit lines BL1, BL2, and BL3, ground selection lines GSL, a plurality of string selection lines SSL1, SSL2, and SSL3, and a common source line CSL that extend in a horizontal direction (X-direction or Y-direction).

The cell strings NS11, NS21, and NS31 are provided between a first bit line BL1 and the common source line CSL; the cell strings NS12, NS22, and NS32 are provided between a second bit line BL2 and the common source line CSL; the cell strings NS13, NS23, and NS33 are provided between a third bit line BL3 and the common source line CSL. Each of the cell strings NS11 through NS33 may include serially connected string selection transistors SST, a plurality of memory cells MC1 through MC8, and a ground selection transistor GST. The number of string selection transistors SST, memory cells MC1 through MC8, and ground selection transistors GST may be variously changed according to example embodiments. In an example embodiment, dummy cells may be disposed between the string selection transistor SST and an eighth memory cell MC8 and/or between the ground selection transistor GST and a first memory cell MC1.

The plurality of memory cells MC1 through MC8 are connected to corresponding word lines WL1 through WL8, respectively. Memory cells located at a same height with respect to a substrate or the ground selection transistors GST may be commonly connected to one word line, and memory cells located at different heights may be respectively connected to different word lines WL1 through WL8. For example, first memory cells MC1 may be commonly connected to a first word line WL1, and second memory cells MC2 may be commonly connected to a second word line WL2.

A drain electrode (or a source electrode) of the ground selection transistors GST may be connected to the common source line CSL, and the gate electrode thereof may be connected to the ground selection line GSL. A drain electrode (or a source electrode) of the string selection transistor SST may be connected to a corresponding bit line, and the gate electrode thereof may be connected to a corresponding string selection line.

As described above with reference to FIG. 1, the ground selection transistors GST and/or the string selection transistor SST may operate as a GIDL transistor in an erase operation. For example, according to a bidirectional GIDL erasing method of charging channel regions of the cell strings NS11 through NS33 in both directions of the cell strings NS11 through NS33, the ground selection transistors GST and the string selection transistors SST may operate as a GIDL transistor. An erase voltage Vers may be provided to drain electrodes of the string selection transistors SST and drain electrodes of the ground selection transistors GST via the plurality of bit lines BL1, BL2 and BL3 and the common source line CSL, and an erase control voltage Vgidl may be provided to the gate electrodes of the string selection transistors SST and gate electrodes of the ground selection transistors GST via the string selection lines SSL1, SSL2, and SSL3 and the ground selection line GSL.

According to a lower GIDL erasing method of charging a channel region of a cell string through lower portions of the cell strings NS11 through NS33, the ground selection transistors GST may operate as a GIDL transistor. Further, according to an upper GIDL erasing method of charging a channel region of a cell string through an upper portion of the cell string, the string selection transistors SST may operate as a GIDL transistor. The string selection transistors SST may be controlled independently of each other according to a corresponding string selection line and a corresponding bit line. Thus, according to the upper GIDL erasing method, an erase operation may be performed on each cell string.

Referring to FIG. 2B, each of cell strings NS11 through NS33 of the memory block BLKa' may include first and second string selection transistors SST1 and SST2 and first and second ground selection transistors GST1 and GST2. The first string selection transistors SST1 may be connected to lower string selection lines SSL1d, SSL2d, and SSL3d, and the second string selection transistors SST2 may be connected to upper string selection lines SSL1u, SSL2u, and SSL3u. The first ground selection transistors GST1 may be connected to upper ground selection lines GSL1u, GSL2u, and GSL3u, and the second ground selection transistors GST2 may be connected to a lower ground selection line GSLd. As illustrated in FIG. 2B, the first ground selection transistors GST1 may be connected to a corresponding upper ground selection line from among the upper ground selection lines GSL1u, GSL2u, and GSL3u and may be independently controlled of each other via a corresponding upper ground selection line. However, the inventive concepts are not limited thereto, and according to an example embodiment, the first ground selection transistors GST1 may also be connected to an identical upper ground selection line to be commonly controlled.

From among the first and second string selection transistors SST1 and SST2 and the first and second ground selection transistors GST1 and GST2, the second string selection transistors SST2 and/or the second ground selection transistors GST2 located at both ends of the cell strings NS11 through NS33 may operate as GIDL transistors in an erase operation. An erase voltage Vers may be provided to drain electrodes of the second string selection transistors SST2 and/or drain electrodes of the second ground selection transistors GST2 via the first through third bit lines BL1, BL2, and BL3 and/or the common source line CSL. An erase control voltage Vgidl may be provided to gate electrodes of the second string selection transistors SST2 and/or gate electrodes of the second ground selection transistors GST2 via the upper string selection lines SSL1u, SSL2u, and SSL3u and/or the lower ground selection line GSLd. Here, an erase pass voltage, which has a lower level than the erase control voltage Vgidl, may be applied to gate electrodes of the first string selection transistors SST1 and/or gate electrodes of the second ground selection transistors GST2.

The equivalent circuits of the memory blocks BLKa and BLKa' are described above as an example with reference to FIGS. 2A and 2B. However, the inventive concepts are not limited thereto, and a memory block having various structures including a plurality of cell strings sharing a bit line may be applied to the memory device 100 according to the example embodiment of the inventive concepts.

Figure 3:
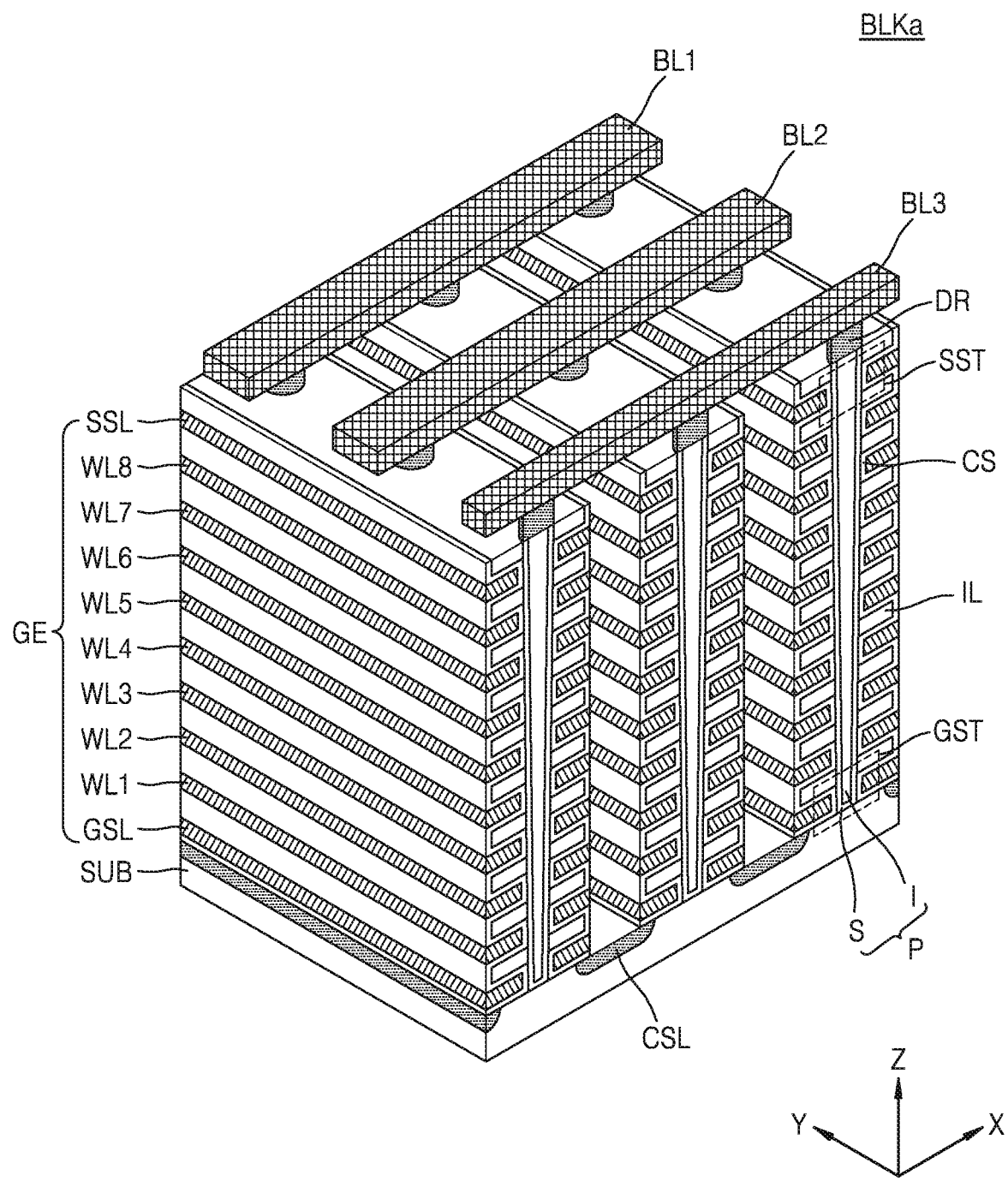
FIG. 3 is a perspective view of a memory block according to an example embodiment of the inventive concepts.

FIG. 3 is a perspective view of a memory block BLKa according to an example embodiment of the inventive concepts.

Referring to FIG. 3, the memory block BLKa is arranged in a direction perpendicular to a substrate SUB (for example, a Z-direction). The memory block BLKa illustrated in FIG. 3 includes two selection lines GSL and SSL, eight word lines WL1 through WL8, and three bit lines BL1 through BL3, but the lines may be more or less than those illustrated.

A substrate SUB is of a first conductivity type (for example, p-type) and extends in a first direction (for example, Y-direction) on the substrate SUB, and a common source line CSL doped with second conductivity-type (for example, n-type) impurities is provided. A plurality of insulating layers IL extending in the first direction are sequentially provided in a third direction perpendicular to the substrate SUB (for example, Z-direction), on an area of the substrate SUB between two adjacent common source lines CSL, and the plurality of insulating layers IL are spaced apart from each other by a preset distance in the third direction. For example, the plurality of insulating layers IL may include an insulating material such as a silicon oxide.

A plurality of pillars P that are sequentially arranged in the first direction and pass through the plurality of insulating layers IL in the third direction are provided in the area of the substrate SUB between two adjacent common source lines CSL. For example, the plurality of pillars P may pass through the plurality of insulating layers IL to contact the substrate SUB. In detail, a surface layer S of each of the pillars P may include a first conductivity-type silicon material and function as a channel region. Meanwhile, an internal layer I of each pillar P may include an insulating material such as a silicon oxide or an air gap.

In an area between two adjacent common source lines CSL, a charge storage layer CS is provided along exposed surfaces of the insulating layers IL, the pillars P, and the substrate SUB. The charge storage layer CS may include a gate electrode insulating layer (also referred to as a 'tunneling insulating layer'), a charge trap layer, and a blocking insulating layer. For example, the charge storage layer CS may have an oxide-nitride-oxide (ONO) structure. In addition, in an area between two adjacent common source lines CSL, gate electrodes GE such as the selection lines GSL and SSL and the word lines WL1 through WL8 are provided on an exposed surface of the charge storage layer CS.

Drain electrodes or drain electrode contacts DR are respectively provided on the plurality of pillars P. For example, the drain electrodes or drain electrode contacts DR may include a silicon material doped with second conductivity-type impurities. The bit lines BL1 through BL3 extending in the second direction (for example, an X-direction) and spaced apart by a preset distance in the first direction may be connected onto the drain electrode contacts DR.

According to the GIDL erasing method of example embodiments of the inventive concepts, when an erase voltage Vers (see FIG. 1) which is a high voltage is applied to drain electrodes DR of the GIDL transistors, that is, drain electrodes DR of the ground selection transistor GST and/or the string selection transistor SST, via the common source line CSL and/or the bit lines BL1, BL2, and BL3, and an erase control voltage Vgidl (see FIG. 1) of an intermediate voltage is applied to a gate electrode of the GIDL transistors, a GIDL current may occur due to a voltage difference between the drain electrode and the gate electrode of the GIDL transistor (that is, Vers−Vgidl). The erase voltage Vers may be supplied to a channel region (for example, the surface layer S) according to holes generated by the GIDL current. A word line erase voltage Vwe, which is a relatively low voltage, (for example, a ground voltage), is provided to the word lines WL1 through WL8. Due to a voltage difference between the erase voltage Vers and the word line erase voltage Vwe, tunneling (for example, Fowler-Nordheim tunneling) is generated, and as holes are injected into the charge storage layer CS, data of memory cells may be erased. That is, a threshold voltage of memory cells may be reduced to a voltage level of an erase state.

Figures 4A, 4B, 5:
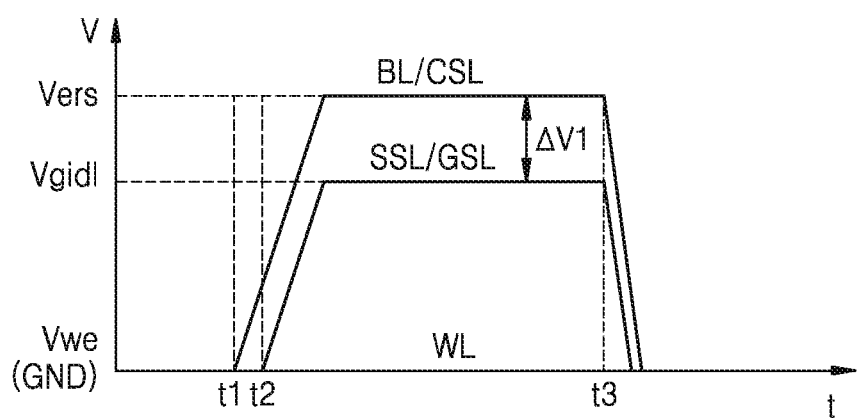
FIG. 4A illustrates an example of erasing bias conditions in an erasing method of a memory device according to an example embodiment of the inventive concepts.
FIG. 4B is a graph showing the erasing bias conditions of FIG. 4A.
FIG. 5 illustrates an example of erasing bias conditions in an erasing method according to an example embodiment of the inventive concepts.

FIG. 4A illustrates an example of erasing bias conditions in an erasing method of a memory device according to an example embodiment of the inventive concepts, and FIG. 4B is a graph showing the erasing bias conditions of FIG. 4A. FIGS. 4A and 4B indicate erasing bias conditions according to a bidirectional GIDL erasing method. In FIG. 4B, the horizontal axis denotes time, and the vertical axis denotes voltage.

Referring to FIG. 4A, in order to perform an erase operation on a memory block BLK, an erase voltage Vers may be applied to a bit line BL and a common source line CSL, and an erase control voltage Vgidl may be applied to a string selection line SSL and a ground selection line GSL, and an erase voltage Vwe may be applied to word lines WL. A GIDL current may be generated in the string selection transistor SST disposed in an upper portion of a cell string and the ground selection transistor GST in a lower portion of the cell string, and holes may be injected from above and under a channel region, that is, from two directions.

Referring to FIG. 4B, the erase voltage Vers may be a high voltage, and the erase control voltage Vgidl may be an intermediate voltage, and the word line erase voltage Vwe may be a low voltage. As a non-limiting example, the erase voltage Vers may be 18 volts (V), the erase control voltage Vgidl may be 12 V, and the word line erase voltage Vwe may be 0 V. According to an example embodiment, as described with reference to FIG. 2B, when each cell string includes a plurality of string selection transistors SST and a plurality ground selection transistors GST, an erase pass voltage (for example, 10 V) may be applied to a string selection line and a ground selection line connected to other string selection transistor SST and other ground selection transistor GST than the string selection transistor SST and the ground selection transistor GST that operate as GIDL transistors.

In order to generate a GIDL current, the erase voltage Vers and the erase control voltage Vgidl may be maintained at a uniform voltage difference (for example, ΔV1). According to an example embodiment, when the erase voltage Vers is applied to a bit line BL and a common source line CSL at a point t1, a voltage level of the bit line BL and the common source line CSL may be increased, and the erase control voltage Vgidl may be applied to the string selection line SSL and the ground selection line GSL at a point t2 at which the voltage level of the bit line BL and the common source line CSL is equal to or higher than a GIDL voltage level. After the voltage level of the bit line BL and the common source line CSL reaches the erase voltage Vers and a voltage level of the string selection line SSL and the ground selection line GSL reaches the erase control voltage Vgidl, the erase voltage Vers and the erase control voltage Vgidl are blocked at a point t3 after a desired (or, alternatively, a predetermined) period of time, and the erase operation may be completed.

Meanwhile, the higher a voltage difference between the erase voltage Vers and the erase control voltage Vgidl, the GIDL current amount may increase (hereinafter, the voltage difference between the erase voltage Vers and the erase control voltage Vgidl will be referred to as a GIDL control level). Moreover, as the erase voltage Vers increases, the amount of tunneling may also increase. However, if the erase voltage Vers increases excessively, holes may be excessively injected into the charge storage layer CS (FIG. 3) to deep-erase some memory cells, causing reliability deterioration. In addition, if the erase control voltage Vgidl decreases excessively, the string selection transistor SST and the ground selection transistor GST may be erased. Accordingly, the erase voltage Vers and the erase control voltage Vgidl are to be appropriately set based on a distribution of threshold voltages of memory cells.

FIG. 5 illustrates an example of erasing bias conditions in an erasing method according to an example embodiment of the inventive concepts. FIG. 5 shows the erasing bias conditions according to an upper GIDL erasing method.

Referring to FIG. 5, in order to perform an erase operation on a memory block BLK according to the upper GIDL erasing method, an erase voltage Vers may be applied to a bit line BL, and an erase control voltage Vgidl may be applied to a string selection line SSL, and a word line erase voltage Vwe may be applied to word lines WL. A ground selection line GSL and a common source line CSL may be floated. Accordingly, a GIDL current is generated in a string selection transistor SST disposed in an upper portion of a cell string, and holes may be injected from above a channel region. Referring to the erasing bias conditions of FIGS. 4A and 5, the erasing bias conditions for performing an erase operation on the memory block BLK according to a lower GIDL erasing method may be easily deduced.

FIG. 6 is a flowchart of an erasing method of a memory device according to an example embodiment of the inventive concepts.

Referring to FIG. 6, in operation S110, when an erasing process on a memory block starts, the memory device 100 may set an erase voltage Vers and an erase control voltage Vgidl. The memory device 100 may set the erase voltage Vers to a relatively high voltage to generate tunneling, and the erase control voltage Vgidl may be set according to the erase voltage Vers and a GIDL voltage level. The GIDL voltage level may be determined according to characteristics of a GIDL transistor. In some example embodiments, an initial value of the erase voltage Vers and an initial value of the erase control voltage Vgidl may be preset, and in operation S110, the memory device 100 may set the erase voltage Vers and the erase control voltage Vgidl based on the initial values and a deterioration amount according to an erase cycle.

In operation S120, the memory device 100 may perform an erase operation based on the set erase voltage Vers and erase control voltage Vgidl. As described with reference to FIG. 4B, an erase operation of a memory block may be performed by applying erasing bias voltages including an erase voltage and an erase control voltage to the memory block.

Next, in operation S130, the memory device 100 may perform an erase verify operation. The memory device 100 may perform an erase verify operation by reading data of memory cells based on an erase verify voltage (hereinafter, 'verify voltage'). For example, when read data has a first logic level, for example, '1', data of a memory cell may be determined as a fail bit; when read data has a second logic level, for example, '0', data of a memory cell may be determined as a pass bit. A fail bit counter included in the memory device 100 may count fail bits. A verify voltage may be set such that a number of fail bits is equal to or less than a number of error check and correct (ECC) bits based on a deterioration amount according to an erase cycle and a distribution of memory cells that are experimentally calculated in a manufacturing process.

According to an example embodiment, when performing a verify operation, the memory device 100 may perform multiple erase verification (that is, multiple sensing) based on a plurality of verify voltages. The memory device 100 may read data from memory cells based on each of the plurality of verify voltages and count the number of fail bits regarding each of the plurality of verify voltages. According to an example embodiment, the memory device 100 may perform erase verification on each cell string, and accordingly, an erase pass or an erase fail may be determined with respect to each cell string.

In operation S140, the memory device 100 may determine an erase pass of a memory block based on a verification result according to the erase verify operation. For example, the memory device 100, specifically, the control logic 120 (FIG. 1), may determine an erase pass based on the number of fail bits, and when the number of fail bits is less than a set (or, alternatively, a predetermined) threshold number, an erase pass may be determined; however, when the number of fail bits is equal to or greater than the threshold number, an erase fail may be determined. In an example embodiment, the threshold number may be set to the number of ECC bits or less. An erase pass indicates that erasing of the memory block is completed, and thus, the erasing process on the memory block may be ended.

In operation S150, when an erase fail is determined, the memory device 100 may determine whether there is one or more slow erase cells among memory cells. According to an example embodiment, the control logic 120 may determine whether there is a slow erase cell by determining a distribution of threshold voltages of memory cells based on the number of fail bits with respect to each of a plurality of verify voltages. For example, when a distribution of the threshold voltages of memory cells has a tail, the control logic 120 may determine that there is a slow erase cell. According to an example embodiment, the control logic 120 may determine an erase pass or an erase fail with respect to each cell string and determine whether there is a slow erase cell based on the erase pass or the erase fail of the cell strings. For example, when an erase-passed cell string occurs, the control logic 120 may determine that there is a slow erase cell in other cell strings.

Threshold voltage distributions of memory cells included in a memory block having a slow erase cell and those in a memory block including no slow erase cell may be different. Accordingly, depending on whether there is a slow erase cell, the memory device 100 may apply, to a next erase loop, a different method of adjusting an erase voltage and an erase control voltage.

In operation S160, when the memory device 100 determines that there is no slow erase cell, the memory device 100 may increase the erase voltage and the erase control voltage by an identical voltage level.

In contrast, in operation S170, when the memory device 100 determines that there is a slow erase cell, the memory device 100 may adjust the erase control voltage such that a voltage difference between the erase voltage and the erase control voltage, that is, a GIDL control level, increases. For example, the control logic 120 may reduce the erase control voltage. According to an example embodiment, when the number of slow erase cells is equal to or greater than a set (or, alternatively, a predetermined) reference number, the control logic 120 may simultaneously adjust the erase voltage and the erase control voltage such that a GIDL control level increases.

Then, in operation S120 associated with a next erase loop, the memory device 100 may perform an erase operation again based on the adjusted erase voltage and/or the adjusted erase control voltage.

In an example embodiment, even when erase pass is not determined in a next loop, operation S150 may be omitted. In operation S150 of a current loop, a distribution of threshold voltages of memory cells and whether there are slow erase cells have already been determined, and accordingly, the memory device 100 may determine a method of adjusting the erase voltage and the erase control voltage applied to a subsequent erase loop based on the above determination result.

Figure 7A:
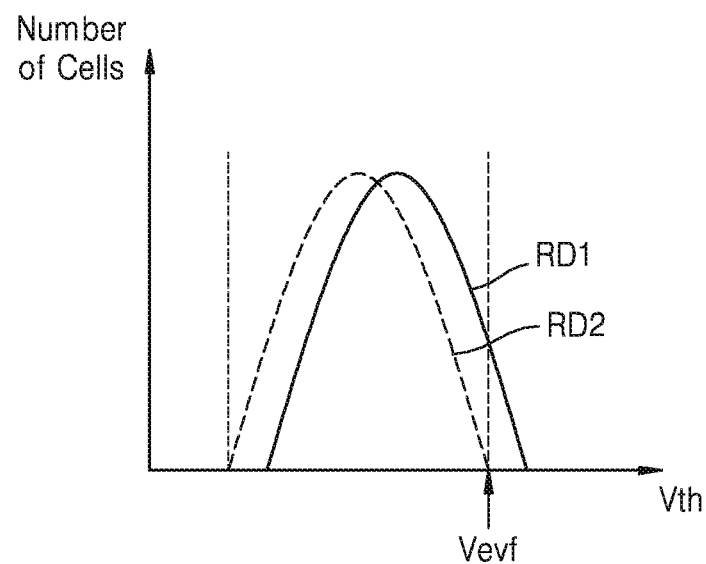
FIGS. 7A and 7B are graphs showing a threshold voltage distribution of memory cells.
Figure 7B:
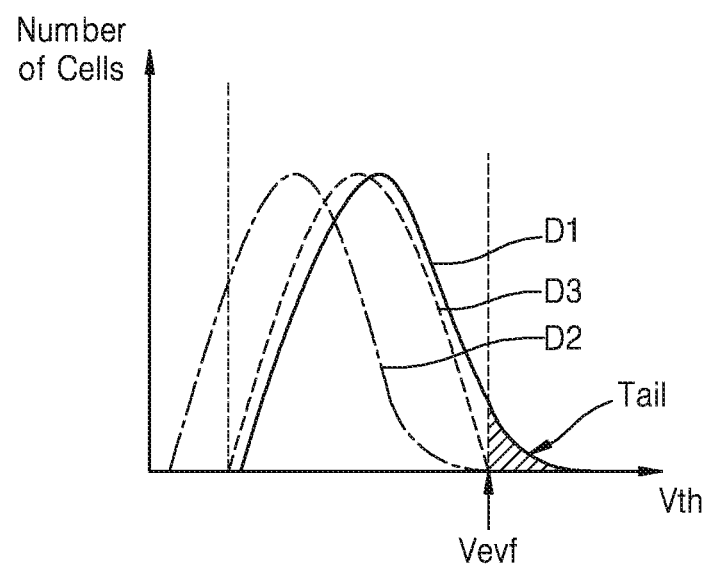

FIGS. 7A and 7B are graphs showing a threshold voltage distribution of memory cells.

The horizontal axis denotes a threshold voltage Vth of memory cells, and the vertical axis denotes the number of memory cells. FIG. 7A shows a threshold voltage distribution of memory cells (hereinafter referred to as a 'distribution of memory cells') when there is no slow erase cell, and FIG. 7B shows a distribution of memory cells when there is a slow erase cell.

Referring to FIG. 7A, when a memory block has erase-failed and there is no slow erase cell, a distribution of memory cells may have a normal shape like a distribution RD1. In an erase-fail state, a threshold voltage of some memory cells is higher than a verify voltage Vevf. According to operation S160 of FIG. 6, the erase voltage is increased, and an erase operation is performed again based on the adjusted erase voltage so that a distribution of memory cells is shifted to the left, forming a distribution RD2. In the distribution RD2, a threshold voltage of most memory cells is lower than the verify voltage Vevf, and thus, the memory block may erase-pass.

Referring to FIG. 7B, when a memory block has erase-failed, and there is a slow erase cell, a distribution of memory cells may be formed in the form of a distribution D1, and the distribution D1 may have a tail.

When an erase voltage is increased similarly to when there is no slow erase cell, and an erase operation is performed again based on the adjusted erase voltage, the distribution of memory cells may be shifted to the left to form a distribution D2 corresponding to an erase pass. However, a threshold voltage Vth of some cells may be reduced excessively. In other words, some cells, for example, fast erase cells may be deep-erased.

Meanwhile, a slow erase cell may be created due to an insufficient GIDL current caused by variations or the like during a manufacturing process. Accordingly, when a voltage difference between a drain electrode and a gate electrode of a GIDL transistor, that is, a voltage difference between an erase voltage and an erase control voltage, increases, a higher GIDL current may be generated. Accordingly, according to operation S170 of FIG. 6, when the erase control voltage is adjusted such that a voltage difference between the erase voltage and the erase control voltage, that is, a GIDL control level, is increased, and an erase operation is performed again based on the adjusted erase control voltage, then a higher GIDL current is generated, thereby reducing a threshold voltage of slow erase cells. That is, the threshold voltage of slow erase cells mostly may be reduced without a significant variation in a threshold voltage of other memory cells than the slow erase cells. Accordingly, a distribution of memory cells like a distribution D3 may be formed.

As described above with reference to FIGS. 4A and 4B, in order to shift a distribution of memory cells, when an erase control voltage is excessively increased, some memory cells may be deep-erased, and when the erase control voltage is deep-erased, a GIDL transistor (for example, a string selection transistor and/or a ground selection transistor) may be erased.

However, according to the memory device 100 and the erasing method of the memory device 100 of example embodiments of the inventive concepts, in a verify operation after performing erasing, whether there is a slow erase cell, that is, whether a distribution of memory cells has a tail, may be determined, and an erase voltage and an erase control voltage applied to a next erase loop may be adjusted based on whether there is a slow erase cell. In other words, according to the memory device 100 and the erasing method of the memory device 100 of example embodiments of the inventive concepts, an erase voltage and an erase control voltage may be adaptively adjusted according to a distribution shape of memory cells. Thus, deep-erasing of memory cells or erasing of selection transistors may be reduced (or, alternatively, prevented), and deterioration of the reliability of a memory cell array according to an erase operation may be reduced (or, alternatively, prevented).

Figure 8A:
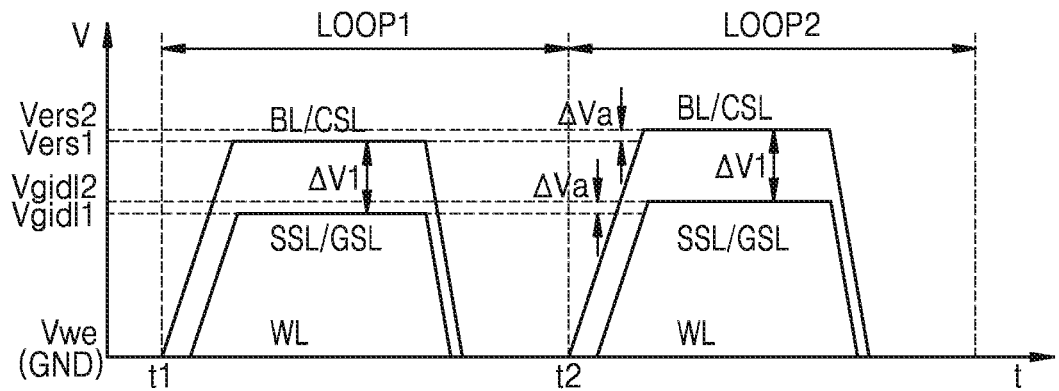
FIGS. 8A, 8B, and 8C are graphs showing erasing bias conditions in an erasing method of a memory device according to example embodiments of the inventive concepts.
Figure 8B:
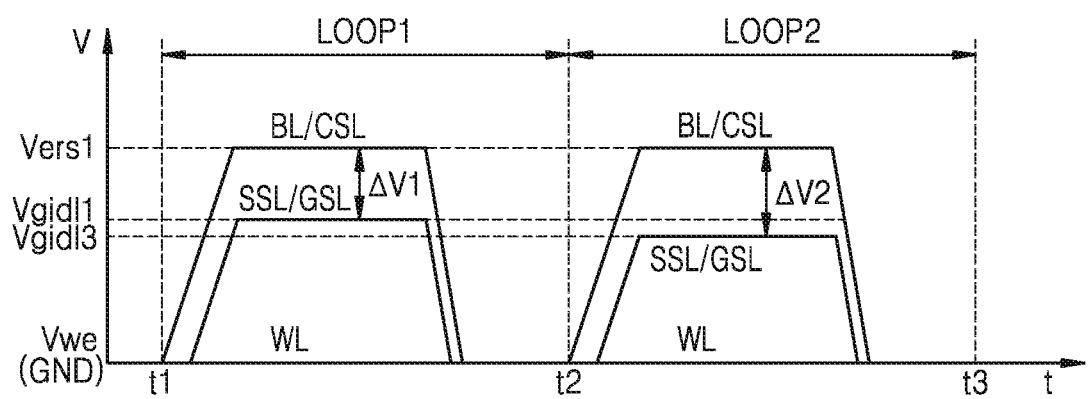
Figure 8C:
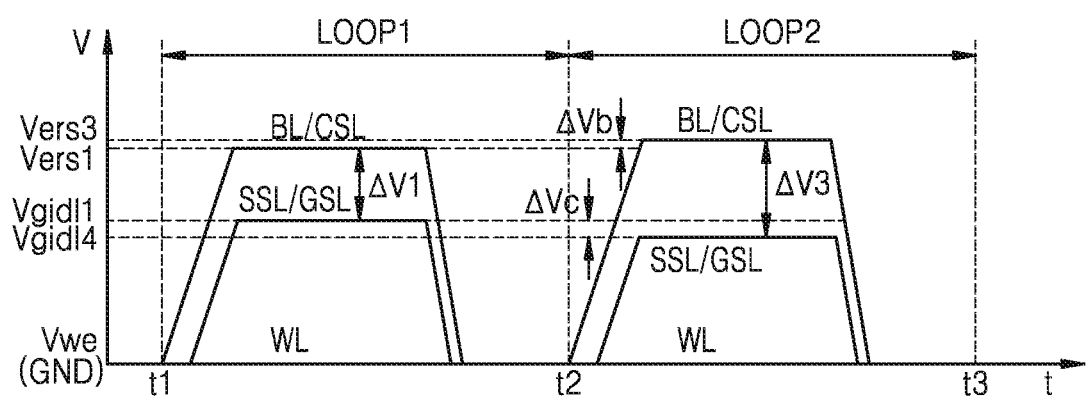

FIGS. 8A, 8B, and 8C are graphs showing erasing bias conditions in an erasing method of a memory device according to example embodiments of the inventive concepts.

FIG. 8A illustrates an example embodiment corresponding to when there is no slow erase cells, and FIGS. 8B and 8C illustrate embodiments corresponding to when there are slow erase cells.

Referring to FIG. 8A, in a first erase loop LOOP1, an erase operation may be performed based on a first erase voltage Vers1, a first erase control voltage Vgidl1, and a word line erase voltage Vwe. After the erase operation is performed in the first erase loop LOOP1, erase verification may be performed. When a memory block has erase-failed, and it is determined that there are no slow erase cells, the control logic 120 (FIG. 1) may increase the erase voltage and the erase control voltage by an identical voltage level. That is, while increasing the erase voltage, the control logic 120 may maintain a GIDL control level uniform.

Accordingly, in a second erase loop LOOP2, an erase operation may be performed based on a second erase voltage Vers2 and a second erase control voltage Vgidl2. The second erase voltage Vers2 and the second erase control voltage Vgidl2 may be respectively higher than the first erase voltage Vers1 and the first erase control voltage Vgidl1 by a first voltage difference ($\Delta$Va). A voltage difference $\Delta$V1 between the second erase voltage Vers2 and the second erase control voltage Vgidl2 may be identical to a voltage difference $\Delta$V1 between the first erase voltage Vers1 and the first erase control voltage Vgidl1. That is, in the second erase loop LOOP2, an erase voltage may be increased, and a same GIDL control level as that of the first erase loop LOOP1 may be maintained.

Referring to FIG. 8B, in a first erase loop LOOP1, an erase operation may be performed based on a first erase voltage Vers1, a first erase control voltage Vgidl1, and a word line erase voltage Vwe, and as a result of erase verification, when it is determined that a memory block has erase-failed and that there are slow erase cells, the control logic 120 may adjust the erase control voltage to adjust a GIDL control level. For example, the control logic 120 may reduce the erase control voltage. Accordingly, in the second erase loop LOOP2, an erase operation may be performed based on the first erase voltage Vers1 and the third erase control voltage Vgidl3, which is lower than the first erase voltage Vers1, and a voltage difference $\Delta$V2 between the first erase voltage Vers1 and the third erase control voltage Vgidl3 may be greater than a voltage difference $\Delta$V1 between the first erase voltage Vers1 and the first erase control voltage Vgidl1. That is, in the second erase loop LOOP2, a GIDL control level may be greater than that of the first erase loop LOOP1.

Meanwhile, when there are slow erase cells, both the erase voltage and the erase control voltage may be adjusted. Referring to FIG. 8C, in a first erase loop LOOP1, an erase operation may be performed based on a first erase voltage Vers1, a first erase control voltage Vgidl1, and a word line erase voltage Vwe, and as a result of erase verification, when a memory block has erase-failed and it is determined that there are slow erase cells, the control logic 120 may increase a GIDL control level by adjusting the erase voltage and the erase control voltage. For example, the control logic 120 may increase the erase voltage and reduce the erase control voltage.

Accordingly, in the second erase loop LOOP2, an erase operation may be performed based on a third erase voltage Vers3 and a fourth erase control voltage Vgidl4. The third erase voltage Vers3 may be higher than the first erase voltage Vers1 by a second voltage difference $\Delta$Vb, and the fourth erase control voltage Vgidl4 may be lower than the first erase control voltage Vgidl1 by a third voltage difference $\Delta$Vc. A voltage difference $\Delta$V3 between the third erase voltage Vers3 and the fourth erase control voltage Vgidl4 may be greater than the voltage difference $\Delta$V1 between the first erase voltage Vers1 and the first erase control voltage Vgidl1. In addition, the second voltage difference $\Delta$Vb may be less than the first voltage difference $\Delta$Va of FIG. 8A. That is, in the second erase loop LOOP2, the erase voltage and the GIDL control level may be increased.

Figure 9:
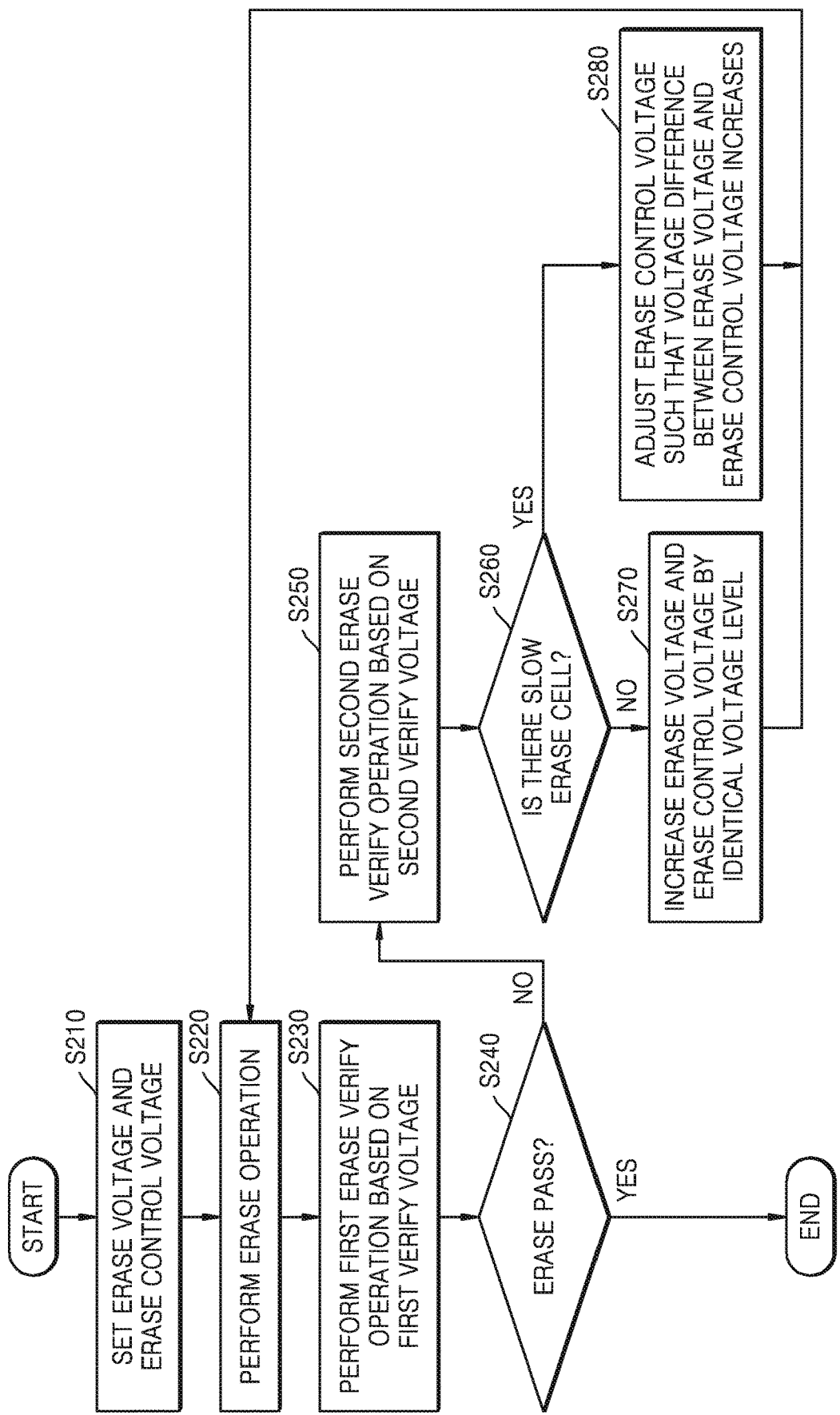
FIG. 9 is a flowchart of an erasing method of a memory device according to an example embodiment of the inventive concepts.

FIG. 9 is a flowchart of an erasing method of a memory device according to an example embodiment of the inventive concepts.

The erasing method of FIG. 9 may be similar to the erasing method of FIG. 6. However, according to the erasing method of FIG. 9, after an erasing method is performed, a plurality of verify operations are performed, and whether there is a slow erase cell may be determined based on a verification result according to the plurality of verify operations. Hereinafter, the erasing method of FIG. 9 will be described by focusing on differences from the erasing method of FIG. 6.

Referring to FIG. 9, in operation S210, when an erasing process on a memory block starts, the memory device 100 may set an erase voltage and an erase control voltage, and, in operation S220, may perform an erase operation based on the set erase voltage and erase control voltage.

In operation S230, After the erase operation is performed, the memory device 100 may perform a first erase verify operation based on a first verify voltage. The memory device 100 may count the number of fail bits with respect to the first verify voltage.

In operation S240, the memory device 100 may determine an erase pass with respect to the memory block based on a result of erase verification. In detail, the control logic 120 may determine that there is an erase pass of the memory block when the number of fail bits regarding the first verify voltage is less than a set (or, alternatively, a predetermined) threshold number of bits, and when the number of fail bits is equal to or greater than a threshold number, the control logic 120 may determine an erase fail of the memory block. An erase pass represents that erasing of the memory block is completed, and thus the erasing process on the memory block may be ended.

In operation S250, when an erase fail of the memory block is determined, the memory device 100 may perform a second erase verify operation based on a second verify voltage. The second verify voltage may be higher than the first verify voltage. The memory device 100 may sense memory cells based on the second verify voltage and count the number of fail bits regarding the second verify voltage.

In operation S260, the memory device 100 may determine whether there are slow erase cells based on a verification result. In an example embodiment, the memory device 100 may determine whether there are slow erase cells based on the number of fail bits regarding a second erase voltage (hereinafter referred to as the number of second fail bits). In an example embodiment, the memory device 100 may determine whether there are slow erase cells based on the number of fail bits with respect to a first erase voltage (hereinafter referred to as the number of first fail bits) and the number of second fail bits. A method of determining whether there are slow erase cells will be described with reference to FIGS. 10A through 12.

Figure 10A:
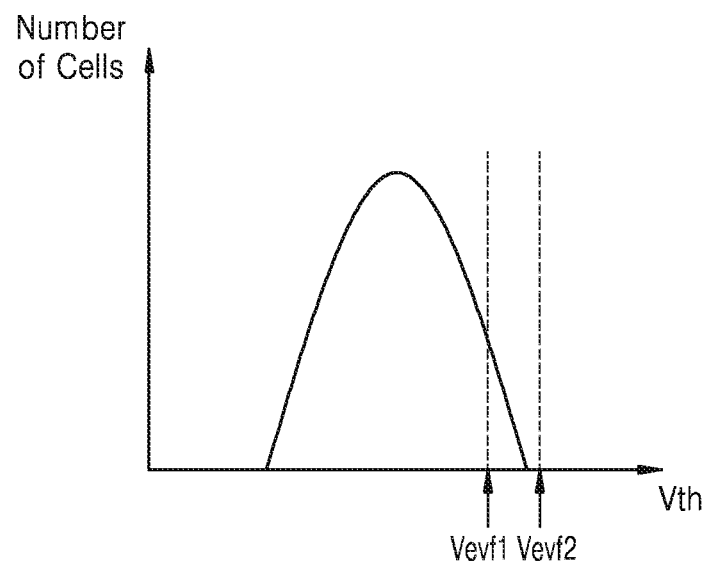
FIGS. 10A and 10B are graphs showing a threshold voltage distribution of memory cells.
Figure 10B:
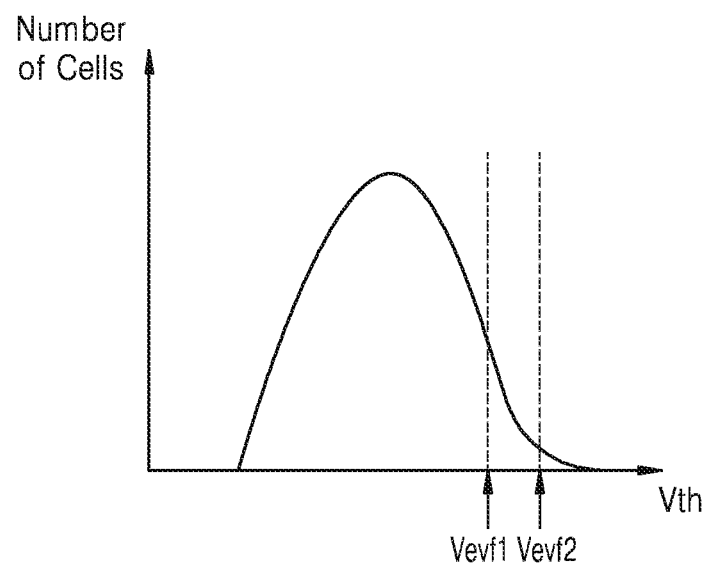

FIGS. 10A and 10B are graphs showing a threshold voltage distribution of memory cells.

The horizontal axis denotes a threshold voltage Vth of memory cells, and the vertical axis denotes the number of memory cells. FIG. 10A shows a distribution of memory cells when there is no slow erase cell, and FIG. 10B shows a distribution of memory cells when there is a slow erase cell.

Referring to FIG. 10A, when a distribution of memory cells has a normal shape, that is, when there are no slow erase cells and a first erase verify operation is performed based on a first verify voltage Vevf1, even if the number of first fail bits exceeds a threshold number to cause an erase fail, when a second erase verify operation is performed based on a second verify voltage Vevf2, which is higher than the first verify voltage Vevf1, no second fail bit may be generated or few second fail bits may be generated.

Meanwhile, referring to FIG. 10B, when a distribution of memory cells has a tail, that is, when there are slow erase cells, there may be a large number of second fail bits when the second erase verify operation is performed according to the second verify voltage Vevf2.

Accordingly, according to the memory device 100 of the example embodiment of the inventive concepts, as will be described later with reference to FIGS. 11 and 12, whether there are slow erase cells may be determined based on the number of second fail bits or on the number of second fail bits and the number of first fail bits.

Figure 11:
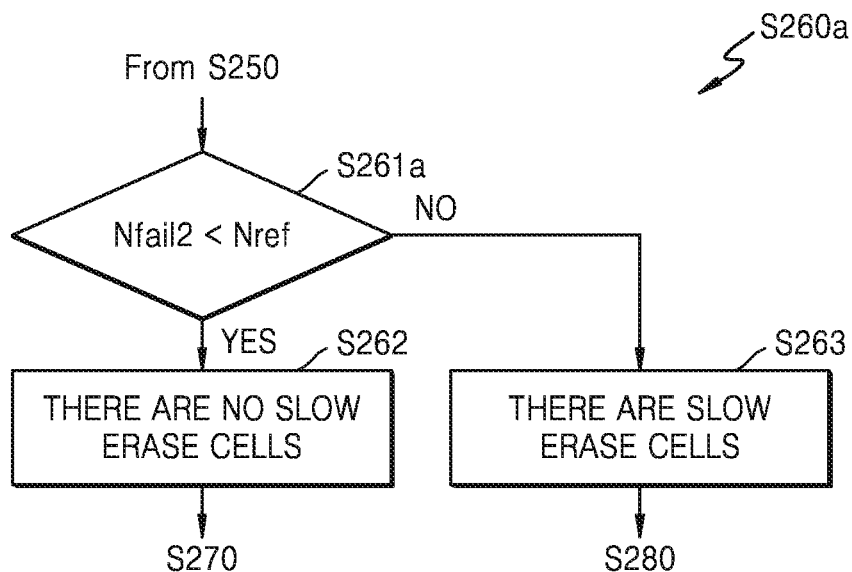
FIGS. 11 and 12 are flowcharts of a method of determining whether there are slow erase cells according to example embodiments of the inventive concepts.
Figure 12:
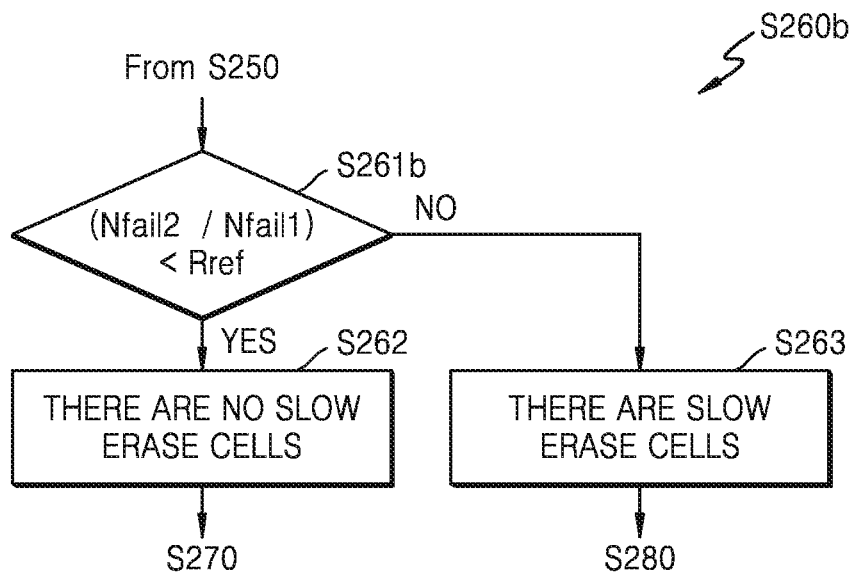

FIGS. 11 and 12 are flowcharts of a method of determining whether there are slow erase cells, according to example embodiments of the inventive concepts.

The determining method of FIGS. 11 and 12 may be applied to operation S260 of FIG. 9.

Referring to FIG. 11, in operation S261a, the memory device 100, specifically, the control logic 120, may compare a result of the second verify operation, that is, a number Nfail2 of second fail bits, with a reference number Nref to determine whether the number Nfail2 of second fail bits is less than the reference number Nref. The reference number Nref may be set based on a normal distribution of memory cells and the first verify voltage Vref1 and the second verify voltage Vref2.

In operation S262, when the number Nfail2 of second fail bits is less than the reference number Nref, the memory device 100 may determine that there are no slow erase cells, and when the number Nfail2 of second fail bits is equal to or greater than the reference number Nref, in operation S263, the memory device 100 may determine that there are slow erase cells.

Referring to FIG. 12, in operation S261b, the memory device 100, specifically, the control logic 120, may compare a ratio of a number Nfail2 of second fail bits with respect to a number Nfail1 of first fail bits (hereinafter referred to as a fail bit ratio) to determine whether the ratio of fail bits (Nfail2/Nfail1) is less than a reference ratio Rref. When the memory cells have a normal distribution, the ratio of fail bits Nfail2/Nfail1 may be small, whereas, when a distribution of memory cells has a tail, the fail bit ratio Nfail2/Nfail1 may be greater than the reference ratio Rref.

In operation S262, when the fail bit ratio Nfail2/Nfail1 is less than the reference ratio Rref, the memory device 100 may determine that there are no slow erase cells, and when the fail bit ratio Nfail2/Nfail1 is equal to or greater than the reference ratio Rref, in operation S263, the memory device 100 may determine that there are slow erase cells.

Referring back to FIG. 9, when in operation S262 the memory device 100 determines that there are no slow erase cells, in operation S270, the memory device 100 may increase an erase voltage and an erase control voltage by an identical voltage level. In contrast, when in operation S263, the memory device 100 determines that there are slow erase cells, in operation S280, the memory device 100 may adjust the erase control voltage such that a voltage difference between the erase voltage and the erase control voltage increases.

According to the present example embodiment, the memory device 100 may determine whether there are slow erase cells by performing multiple erase verification. Meanwhile, while FIG. 9 illustrates that an erase verify operation is performed twice, example embodiments are not limited thereto, and erase verification may be performed three or more times based on different erase verify voltages. The control logic 120 may estimate a distribution shape of memory cells based on a plurality of erase verification results and determine whether there are slow erase cells based on the distribution shape.

Figure 13:
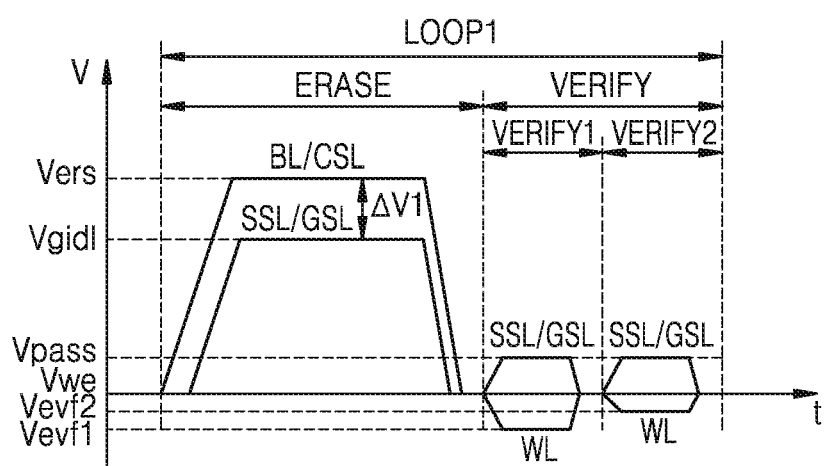
FIG. 13 is a graph showing an example of erasing bias conditions in an erasing method according to an example embodiment of the inventive concepts.

FIG. 13 is a graph showing an example of erasing bias conditions in an erasing method according to an example embodiment of the inventive concepts.

Referring to FIG. 13, in an erase loop, for example, in a first erase loop LOOP1, after an erase operation is performed in an erase section ERASE, an erase verify operation may be performed in an erase verification section VERIFY. The erasing bias conditions for the erase operation are described above with reference to FIGS. 8A through 8C, and thus, description thereof will be omitted.

A first erase verify operation may be performed based on a first verify voltage Vevf1 in a first section VERIFY1 of the erase verification section VERIFY. The first verify voltage Vevf1 may be applied to word lines WL, and a pass voltage Vpass may be applied to a string selection line SSL and a ground selection line GSL. For example, the pass voltage Vpass may be a positive voltage of 1 V or higher, and the first verify voltage Vevf1 may be a positive voltage or a negative voltage around a ground voltage (for example, 0.5 or lower). As an unlimited example, the pass voltage Vpass may be 4 V, and the first verify voltage V evf1 may be −0.4 V.

Accordingly, the string selection transistor SST (FIG. 2A) and the ground selection transistor GST (FIG. 2A) may be turned on, and first erase verification may be performed on the memory cells MC1 through MC8 (FIG. 2A).

When an erase fail is determined as a result of the first erase verification, a second erase verify operation may be performed in a second section VERIFY2. A second verify voltage Vevf2 may be applied to the word lines WL, and a pass voltage Vpass may be applied to the string selection line SSL and the ground selection line GSL. The second verify voltage Vevf2 may be a positive voltage or a negative voltage around a ground voltage (for example, 0.5 or lower) and may be higher than the first verify voltage Vevf1. As a non-limiting example, the second verify voltage Vevf2 may be −0.2 V.

Accordingly, the string selection transistor SST (FIG. 2A) and the ground selection transistor GST (FIG. 2A) may be turned on, and second erase verification may be performed on the memory cells MC1 through MC8 (FIG. 2A).

As described above, when an erase fail is determined as a result of the first erase verification, the memory device 100 may perform multiple erase verification (that is, multiple sensing) by increasing a voltage level of a verify voltage. The memory device 100 may determine whether there are slow erase cells based on a result of multiple erase verification.

Figure 14:
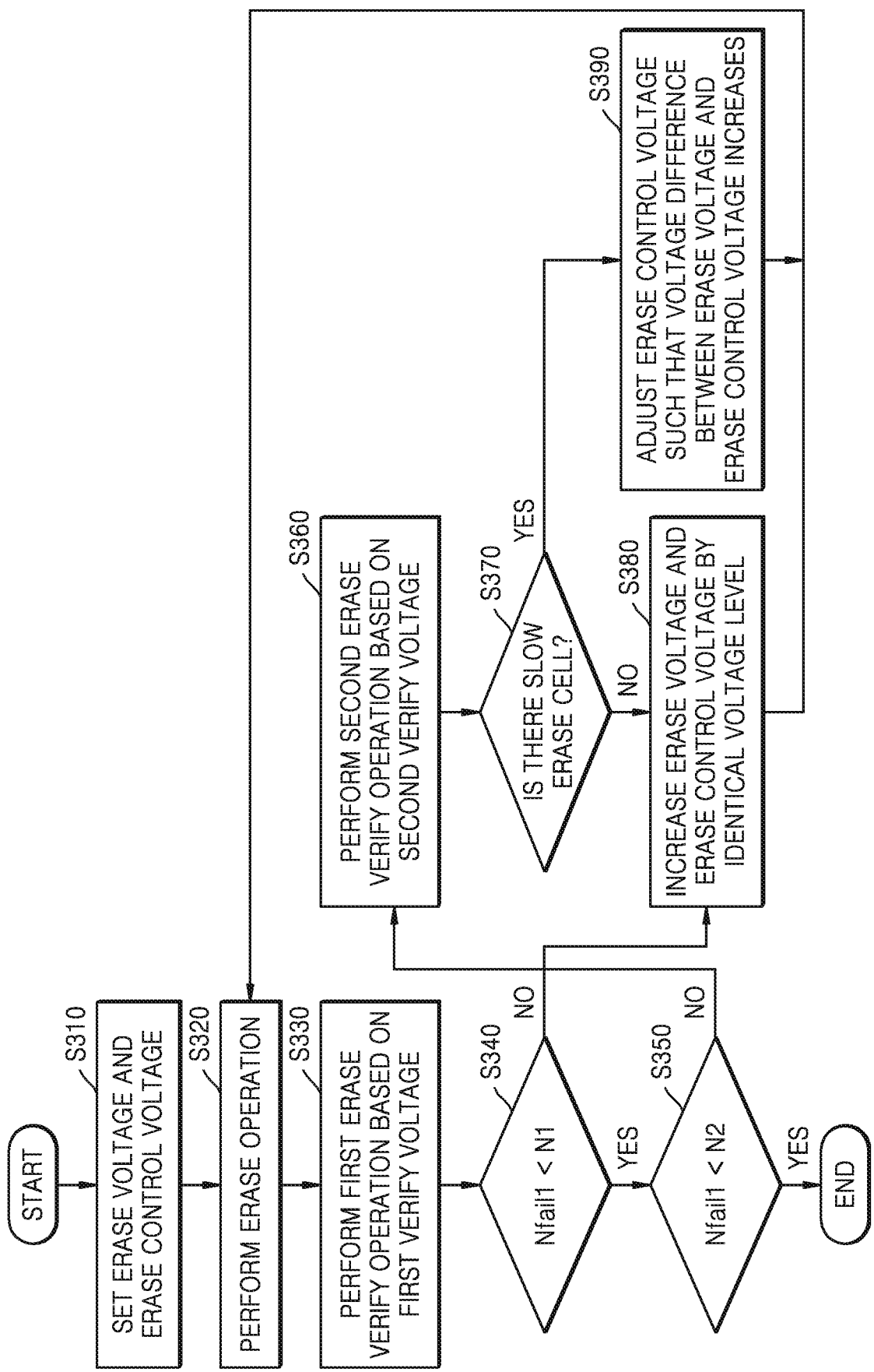
FIGS. 14 and 15 are flowcharts of an erasing method of a memory device according to an example embodiment of the inventive concepts.
Figure 15:
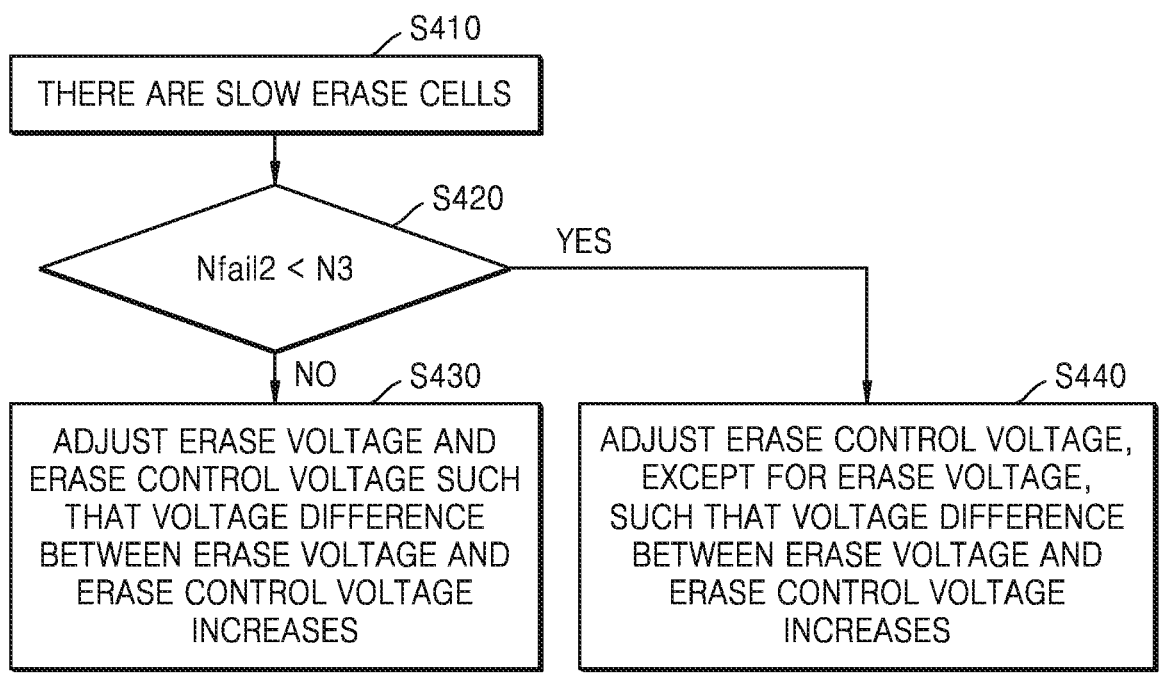

FIGS. 14 and 15 are flowcharts of an erasing method of a memory device according to an example embodiment of the inventive concepts.

The erasing method of FIG. 14 is a modified embodiment of the erasing method of FIG. 9. Thus, the erasing method of FIG. 14 will be described by focusing on differences from the erasing method of FIG. 9.

Referring to FIG. 14, in operation S310, when an erasing process on a memory block starts, the memory device 100 may set an erase voltage and an erase control voltage, and, in operation S320, may perform an erase operation based on the set erase voltage and erase control voltage. In operation S330, after the erase operation is performed, the memory device 100 may perform a first erase verify operation based on a first verify voltage. The memory device 100 may count a number Nfail1 of first fail bits with respect to the first verify voltage.

In operation S340, the memory device 100 may compare the number of first fail bits Nfail1 with a first threshold number N1.

In operation S380, when the number Nfail1 of first fail bits is equal to or greater than the first threshold number N1, the memory device 100 may increase the erase voltage and the erase control voltage by an identical voltage level and perform a next erase loop based on the increased erase voltage and the increased erase control voltage. That is, the memory device 100 may determine that a considerable amount of memory cells are not erased and increase the erase voltage to shift a distribution of the memory cells.

In operation S350, when the number Nfail1 of the first fail bits is less than the first threshold number N1, the memory device 100 may determine that a considerable amount of memory cells is erased and may determine whether the number Nfail1 of first fail bits is less than a second threshold number N2. That is, the memory device 100 may determine whether the memory block has erase-passed or not.

The first threshold number N1 and the second threshold number N2 may be positive integers, and the first threshold number N1 may be greater than the second threshold number N2. According to an example embodiment, the second threshold number N2 may be set to be the number of ECC bits or less.

When the number Nfail1 of first fail bits is less than the second threshold number N2, the memory device 100 may determine that the memory block has erase-passed and end the erase operation.

In operation S360, when the number Nfail1 of first fail bits is equal to or greater than the second threshold number N2, the memory device 100 may perform a second erase verify operation to determine whether there are slow erase cells among memory cells that are not erased.

In operation S370, the memory device 100 may determine whether there are slow erase cells based on a result of the second erase verification or based on results of the first erase verification and the second erase verification, and when the memory device 100 determines that there are slow erase cells, in operation S390, the memory device 100 may adjust the erase control voltage such that a voltage difference between the erase voltage and the erase control voltage is increased. In other words, the memory device 100 may increase a GIDL control level. Next, an erase operation may be performed based on the adjusted erase voltage and erase control voltage.

Meanwhile, when there are slow erase cells, as discussed below with reference to FIG. 15, a method of adjusting the erase voltage and the erase control voltage may be varied based on the number of slow erase cells.

Referring to FIG. 15, when it is determined in operation S410 that there are slow erase cells, in operation S420, the memory device 100 may compare a number Nfail2 of second fail bits with a set (or, alternatively, a predetermined) reference value N3 to determine whether the number Nfail2 of second fail bits is less than the predetermined reference value N3.

In operation S430, when the number Nfail2 of second fail bits is equal to or greater than the reference value N3, the memory device 100 may adjust the erase voltage and the erase control voltage such that a voltage difference between the erase voltage and the erase control voltage increases. For example, the control logic 120 may adjust the erase voltage and the erase control voltage as described above with reference to FIG. 8C.

As described above, when the number Nfail2 of second fail bits is equal to or greater than the reference value N3, the memory device 100 may determine that the number of slow erase cells from among unerased memory cells is relatively large. When the erase voltage is excessively reduced to shift a distribution of the large number of slow erase cells, that is, to generate a GIDL current, then a string selection transistor and a ground selection transistor may be erased. Accordingly, to increase an amount of shift of a distribution of slow erase cells by shifting the distribution of memory cells as a whole, as described above, the control logic 120 may increase the erase voltage and may also reduce the erase control voltage such that a GIDL level increases.

In operation S440, when the number Nfail2 of second fail bits is less than the predetermined reference value N3, the memory device 100 may adjust the erase control voltage, except for the erase voltage, such that a voltage difference between the erase voltage and the erase control voltage increases. When the number Nfail2 of second fail bits is less than the reference value N3, the memory device 100 may determine that the number of slow erase cells from among unerased memory cells is relatively small, and maintain the erase voltage as before and adjust the erase control voltage to thereby increase a voltage difference between the erase voltage and the erase control voltage, that is, a GIDL control level.

According to the present example embodiment, when there are slow erase cells, the erase control voltage is adjusted such that a voltage difference between the erase voltage and the erase control voltage increases, and when it is determined that there are a relatively large number of slow erase cells, the erase voltage is also adjusted to increase a shift amount of a distribution of the slow erase cells; however, when it is determined that there is a relatively small number of slow erase cells, only the erase control voltage is adjusted to shift a distribution of the slow erase cells.

Figure 16:
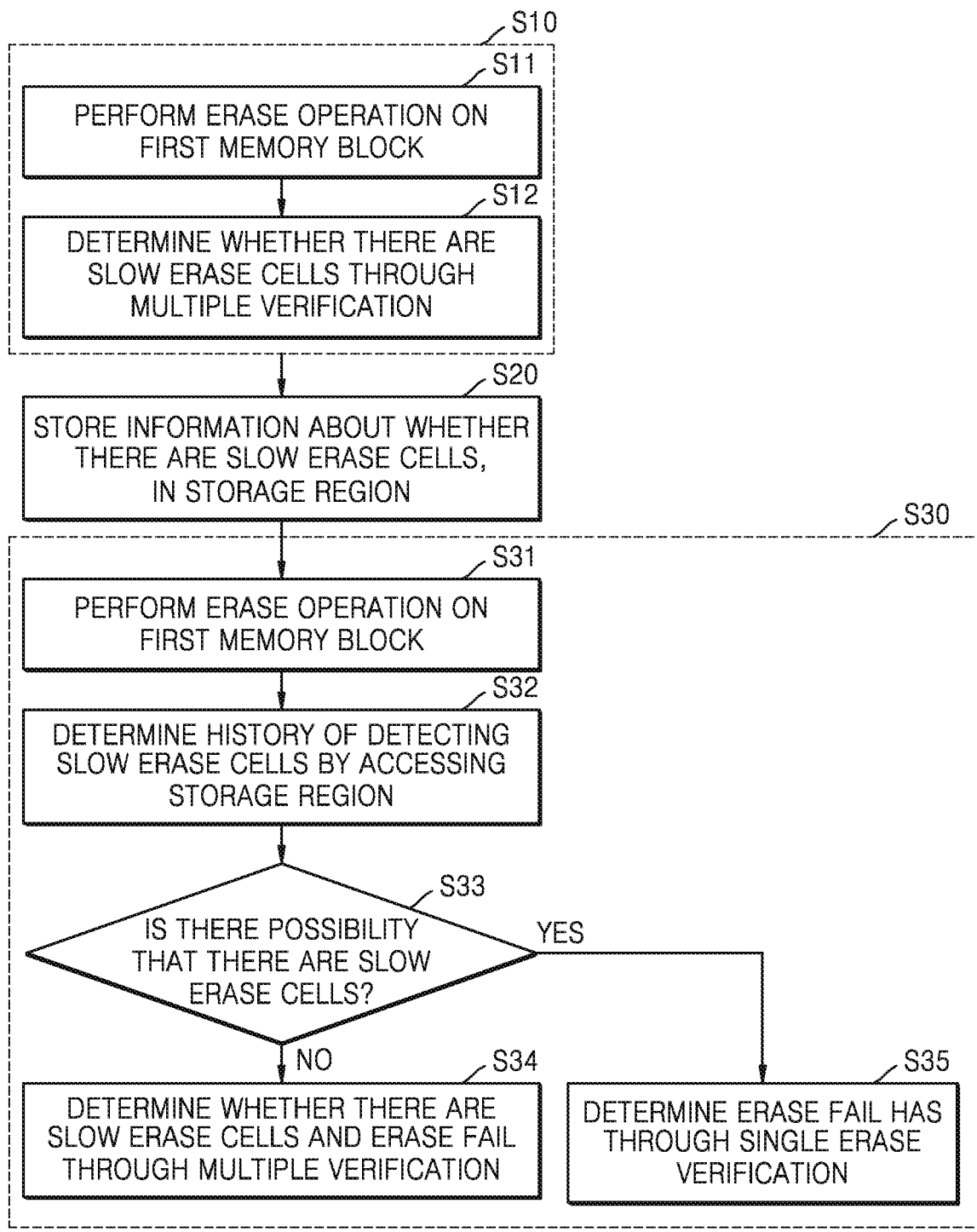
FIG. 16 is a flowchart of an operating method of a memory device according to an example embodiment of the inventive concepts.

FIG. 16 is a flowchart of an operating method of a memory device 100 according to an example embodiment of the inventive concepts.

Referring to FIG. 16, in operation S10, the memory device 100 may perform erasing on a first memory block. The erasing of operation S10 may be an initial erase operation performed on a memory block. The erasing method according to the above-described various embodiments of the inventive concepts may be applied to operation S10.

In operation S10, an erase operation on the first memory block may be performed (S11), and whether there are slow erase cells may be determined through multiple verification (S12). The erase operation of operation S11 and the verify operation of operation S12 may be repeated until erasing is completed, that is, until an erase pass is obtained.

According to the above-described various example embodiments, when an erase fail is determined as a result of erase verification, the memory device 100 may adjust an erase voltage and an erase control voltage based on whether there are slow erase cells.

In operation S20, when erasing is completed, the memory device 100 may store information about whether there are slow erase cells, in an internal storage region. For example, the control logic 120 (FIG. 1) may store information indicating whether there are slow erase cells in a storage region such as a register, the memory cell array 110 (FIG. 1) or an OTP memory included in the memory device 100. According to an example embodiment, information about whether there are slow erase cells may be stored in units of memory blocks, that is, in groups of memory blocks or in units of memory chips (that is, semiconductor chips in which the memory device 100 is mounted). For example, the memory device 100 may store, in a storage region, information indicating whether slow erase cells are detected during a process in which an erase operation on a plurality of adjacent memory blocks included in a memory block group is performed.

Next, in operation S30, erasing may be performed again on the first memory block. For example, performing a write operation (i.e., programming) on the first memory block, and when the first memory block is programmed a reference number of times or more or the first memory block has no effective area to store data, the first memory block may be erased.

For example, in operation S31, an erase operation may be performed on the first memory block.

In operation S32, before performing erase verification, the memory device 100 may determine a history of detecting slow erase cells by accessing a storage region. For example, the memory device 100 may determine a history of detecting slow erase cells with respect to a memory block group or a memory chip in which the first memory block is included.

In operation S33, the memory device 100 may determine a possibility that there may be slow erase cells in the first memory block based on a result of the determination. For example, when the information stored in a storage device indicates that there is a history of detecting slow erase cells with respect to a memory block group in which the first memory block is included, the memory device 100 may determine that there is a possibility that there are slow erase cells in the first memory block. On the contrary, when the information stored in the storage device indicates that there is no history of detecting slow erase cells with respect to the memory block group in which the first memory block is included, the memory device 100 may determine that there is no possibility that there are slow erase cells in the first memory block.

In operation S34, when it is determined that there is a possibility that there are slow erase cells, the memory device 100 may determine whether there are slow erase cells and whether the first memory block? has erase-failed through multiple verification.

In operation S35, when it is determined that there is no possibility that slow erase cells exist, the memory device 100 may determine whether the first memory block has erase-failed through a single erase verification.

According to the operating method of the memory device 100 of the present example embodiment, when there is no history indicating that there are slow erase cells in a previous erasing process, it is determined that there are no slow erase cells in a memory block and single verification is performed to reduce the time spent for erase verification.

Figure 17:
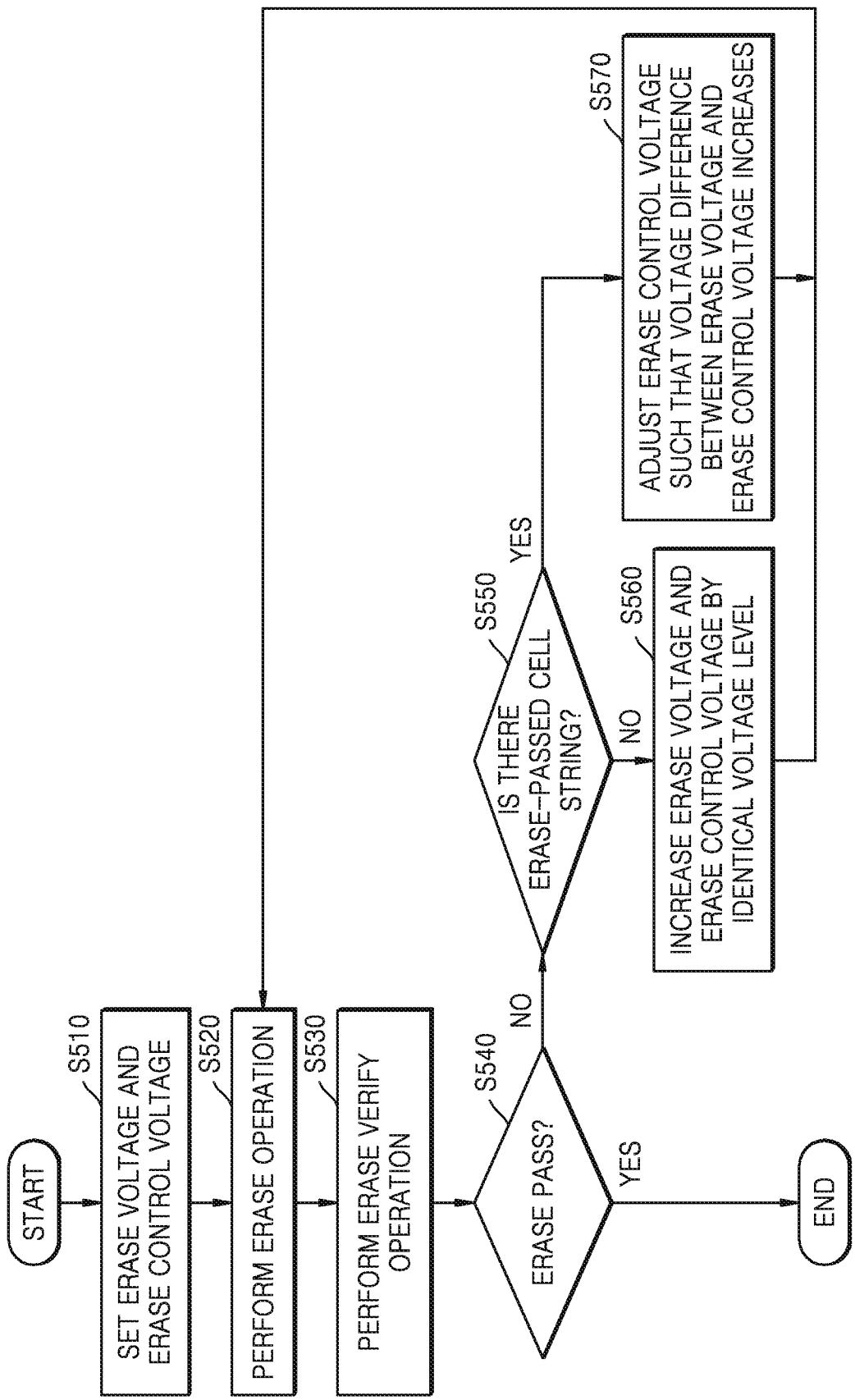
FIG. 17 is a flowchart of an erasing method of a memory device according to an example embodiment of the inventive concepts.

FIG. 17 is a flowchart of an erasing method of a memory device 100 according to an example embodiment of the inventive concepts.

Referring to FIG. 17, in operation S510, when an erasing process on a memory block starts, the memory device 100 may set an erase voltage and an erase control voltage, and, in operation S520, may perform an erase operation based on the set erase voltage and erase control voltage.

In operation S530, after performing the erase operation, the memory device 100 may perform an erase verify operation based on a verify voltage. According to an example embodiment, an erase verify operation may be performed according to each cell string. The memory device 100 may count the number of fail bits of each cell string. Alternatively, an erase pass or an erase fail with respect to each of a plurality of cell strings may be determined based on a level of data read from each cell string.

In operation S540, the memory device 100 may determine an erase pass of a memory block based on a result of the erase verify operation. For example, when the number of fail bits of each cell string is summed, and the summed value is less than a threshold number, the memory block may be determined to have erase-passed. As another example, when all of a plurality of cell strings are determined to be in an erase pass state, the memory block may be determined to have erase passed. When the memory block is determined to have erase passed, the erasing process on the memory block may be ended.

In operation S550, when an erase fail is determined, the memory device 100 may determine whether there is an erase-passed cell string.

In operation S560, when there is no erase-passed cell string, a distribution of memory cells is to be shifted as a whole, and thus, the memory device 100 may increase the erase voltage and the erase control voltage by an identical voltage level.

In contrast, in operation S570, when there is an erase-passed cell string, it may be determined that most memory cells are erased and there are some slow erase cells. Thus, in order to shift a distribution of slow erase cells, the memory device 100 may adjust the erase control voltage to increase a GIDL control level.

According to operation S560 or operation S570, after the erase control voltage and/or the erase voltage are adjusted, in operation S520, an erase operation may be performed again based on the adjusted erase voltage and erase control voltage. In an example embodiment, when it is determined that there is an erase-passed cell string in operation S550, when performing the erase operation, the erase operation on erase-passed cell strings is blocked, and the erase operation may be performed on erase-failed cell strings. Thus, deep-erasing of memory cells included in the erase-passed cell strings may be reduced (or, alternatively, prevented).

FIG. 18 is a diagram illustrating an example of the erasing method of the memory device 100 of FIG. 17.

Referring to FIG. 18, in an Nth (N is an integer of 1 or greater) erase loop LOOP_N, an erase operation may be performed based on a first erase voltage Vers1 and a first erase control voltage Vgidl1. An erase operation may be performed on all of cell strings SSL0 through SSLn included in a memory block of the Nth erase loop LOOP_N. In an example embodiment, when an erase operation is performed on all cell strings, the erase operation may be performed by using a bidirectional GIDL erasing method or a lower GIDL erasing method. Next, erase verification may be performed, and an erase pass or an erase fail may be determined with respect to each cell string.

When an erase fail is determined with respect to all of the cell strings SSL0 through SSLn, in an N+1th erase loop LOOP_N+1, an erase voltage and an erase control voltage may be increased, and an erase operation may be performed based on the adjusted erase voltage and erase control voltage. In the N+1th erase loop LOOP_N+1, an erase operation may be performed based on a second erase voltage Vers2 and a second erase control voltage Vgidl2. The second erase voltage Vers2 may be higher than the first erase voltage Vers1, and the second erase control voltage Vgidl2 may be higher than the first erase control voltage Vgidl1. However, a voltage difference $\Delta 2$ between the second erase voltage Vers2 and the second erase control voltage Vgidl2 may be equal to a voltage difference $\Delta 1$ between the first erase voltage Vers1 and the first erase control voltage Vgidl1. That is, in an erasing process of the N+1th erase loop LOOP_N+1, an erase voltage may be increased compared to the erasing process of the Nth erase loop LOOP_N, and a GIDL control level may be identical.

After the erase operation is performed, erase verification may be performed, and an erase pass or an erase fail may be determined with respect to each cell string. Here, it will be assumed that some cell strings from among the cell strings SSL0 through SSLn, for example, a first cell string SSL0 and an n+1th cell string SSLn have erase-passed, and other cell strings SSL1 through SSLn−1 have erase-failed.

When some cell strings have erase-passed, in an N+2th erase loop LOOP_N+2, the first cell string SSL0 and the n+1th cell string SSLn that have erase-passed may be erase-inhibited, and an erase operation may be performed on other cell strings SSL1 through SSLn−1. According to the upper GIDL erasing method, as a string selection transistor operates as a GIDL transistor, an erase operation (or an erase inhibit operation) may be controlled according to each cell string. In the N+2th erase loop LOOP_N+2, an erase operation may be performed based on a second erase voltage Vers2 and a third erase control voltage Vgidl3. A voltage difference $\Delta V3$ between the second erase voltage Vers2 and the third erase control voltage Vgidl3 may be greater than the voltage difference $\Delta V2$ between the second erase voltage Vers2 and the second erase control voltage Vgidl2. That is, in the N+2th erase loop LOOP_N+2, the erase voltage may not be changed and a GIDL control level may be increased. When the erase operation is completed, erase verification may be performed on the cell strings SSL1 through SSLn−1, thereby determining an erase-pass or an erase-fail with respect to the cell strings SSL1 through SSLn−1.

Figure 19:
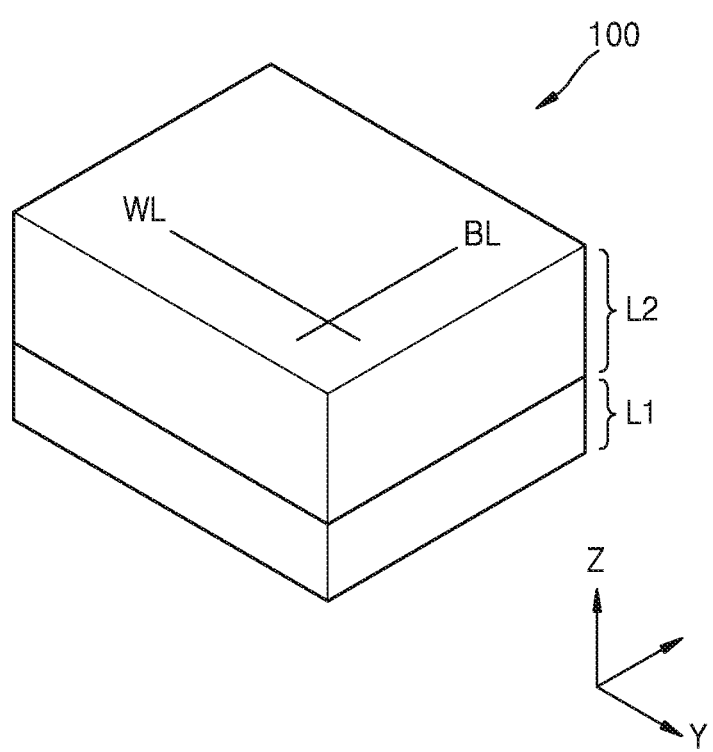
FIG. 19 is a schematic diagram illustrating a structure of a memory device according to an example embodiment of the inventive concepts.

FIG. 19 is a schematic diagram illustrating a structure of a memory device according to an example embodiment of the inventive concepts. FIG. 19 may illustrate an example of a structure of the memory device 100 of FIG. 1. Hereinafter, description will be made by referring to both FIGS. 1 and 19.

Referring to FIG. 19, the memory device 100 may include a first semiconductor layer L1 and a second semiconductor layer L2. The second semiconductor layer L2 may be stacked on the first semiconductor layer L1 in a third direction. In an example embodiment, at least one of the control logic 120, the voltage generator 130, the row decoder 140, and the page buffer unit 150 may be formed in the first semiconductor layer L1, and the memory cell array 110 may be formed in the second semiconductor layer L2. For example, the first semiconductor layer L1 may include a lower substrate, and semiconductor devices such as transistors and patterns for wiring the semiconductor devices may be formed on the lower substrate, thereby forming various circuits in the first semiconductor layer L1.

After circuits are formed in the first semiconductor layer L1, the second semiconductor layer L2 including the memory cell array 110 may be formed. For example, the second semiconductor layer L2 may include substrates, and by forming a plurality of gate conductive layers stacked on each substrate and a plurality of pillars passing through the plurality of gate conductive layers to extend in a direction perpendicular to an upper surface of each substrate (for example, a Z-direction), the memory cell array 110 may be formed in the second semiconductor layer L2. In addition, in the second semiconductor layer L2, patterns electrically connecting the memory cell array 110 (that is, the word lines WL and the bit lines BL) and the circuits formed in the first semiconductor layer L1 may be formed. For example, the word lines WL may extend in a first direction and be arranged in a second direction. Also, the bit lines BL may extend in the second direction and be arranged in the first direction.

Thus, the memory device 100 may have a structure in which the control logic 120, the row decoder 140, the page buffer unit 150, or other various peripheral circuits and the memory cell array 110 are arranged in a stacking direction (e.g., Z-direction), that is, a Cell-On-Peri or Cell-Over-Peri (COP) structure. By arranging the circuits, except for the memory cell array 110, below the memory cell array 110, the COP structure may effectively reduce an area occupied by a plane perpendicular to the stacking direction, and accordingly, a degree of integration of the memory device 100 may be increased.

Figure 20:
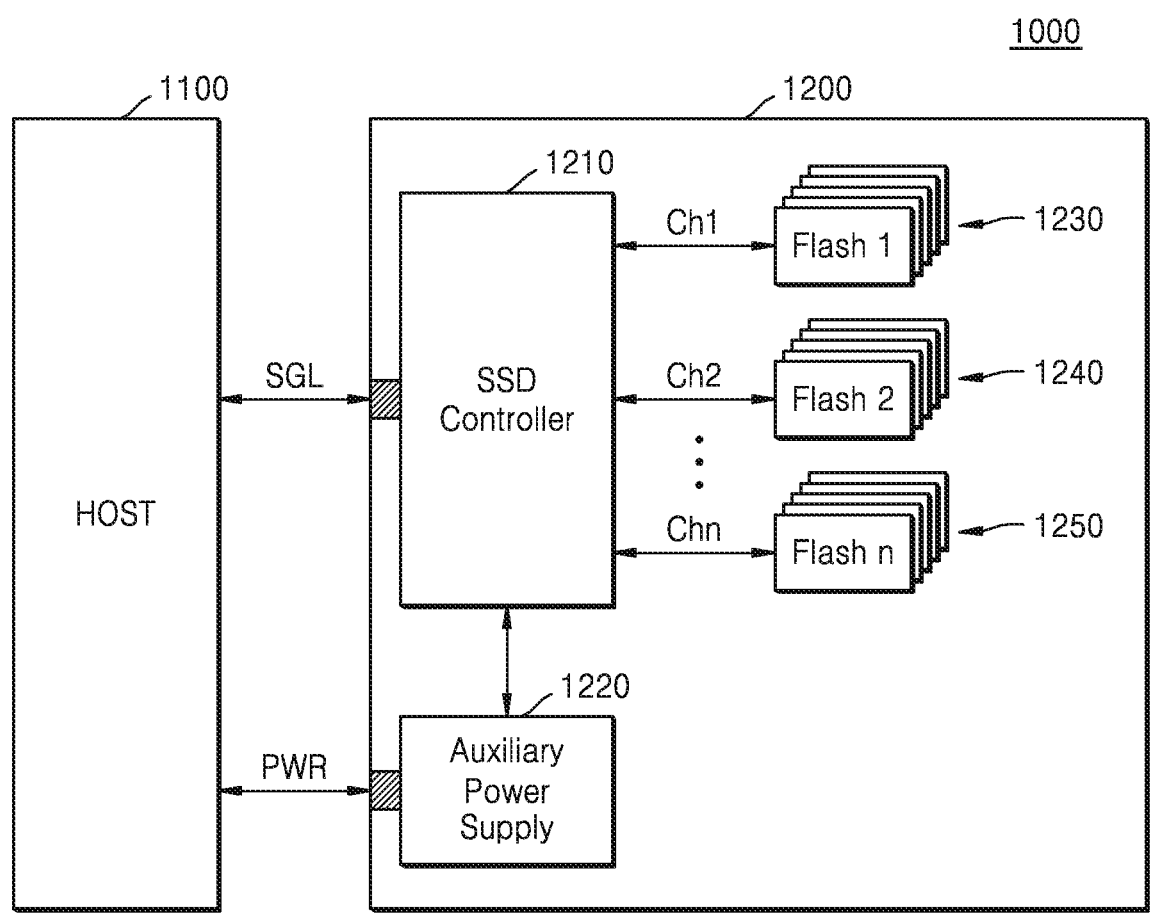
FIG. 20 is a block diagram illustrating an example in which a memory device according to example embodiments of the inventive concepts is applied to a solid state disk (SSD) system.

FIG. 20 is a block diagram illustrating an example in which a memory device according to example embodiments of the inventive concepts is applied to a solid state disk (SSD) system 1000.

Referring to FIG. 20, the SSD system 1000 may include a host 1100 and an SSD 1200. The SSD 1200 may transmit or receive a signal to or from the host 1100 through a signal connector and may receive power through a power connector. The SSD 1200 may include an SSD controller 1210, an auxiliary power supply 1220, and a plurality of flash memory devices 1230, 1240, and 1250. The SSD 1200 may be implemented based on the embodiments illustrated in FIGS. 1 through 19.

In detail, the memory device 100 of FIG. 1 may be applied to at least one of the flash memory devices 1230 through 1250. Accordingly, when at least one of the flash memory devices 1230 through 1250 performs an erase verify iteration on a memory block, the at least one of the flash memory devices 1230 through 1250 may determine whether there are slow erase cells and may adjust an erase voltage and an erase control voltage based on whether there are slow erase cells, that is, based on a distribution shape of memory cells to thereby reduce (or, alternatively, prevent) deep-erasing of the memory cells or erasing of selection transistors. Thus, deterioration of the reliability of the memory device 100 may be reduced (or, alternatively, prevented) and durability of the SSD 1200 may be enhanced.

The memory device 100 according to the example embodiments of the inventive concepts may be mounted in or applied to not only the SSD 1200 but also in or to a memory card system, a computing system, a Universal Flash storage (UFS) or the like.

According to one or more example embodiments, the units and/or devices described above, such as the components of the non-volatile memory device 100 including the control logic 120 may be implemented using hardware, a combination of hardware and software, or a non-transitory storage medium storing software that is executable to perform the functions of the same.

Hardware may be implemented using processing circuity such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be illustrated as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments of the inventive concepts have been particularly shown and described with reference to example embodiments thereof, it will be understood by those of ordinary skill in the art that various changes may be made therein without departing from the spirit and scope of the inventive concepts. Therefore, the scope of example embodiments of the inventive concepts are defined not by the detailed description of example embodiments of the inventive concepts but by the appended claims and any equivalent ranges thereto.

What is claimed is:

1. A method of erasing a non-volatile memory device, the non-volatile memory device including a plurality of cell strings having a plurality of memory cells and selection transistors connected together, the method comprising:
   performing a first erase operation based on an erase voltage and an erase control voltage, the erase voltage being applied to a first electrode of at least one of the selection transistors and the erase control voltage being applied to a second electrode of the at least one of the selection transistors;
   determining whether there are slow erase cells among the plurality of memory cells by performing a multiple erase verify operation based on a first verify voltage and a second verify voltage, the second verify voltage being higher than the first verify voltage;
   adjusting, in response to determining that the slow erase cells are present, the erase control voltage to generate an adjusted erase control voltage such that a voltage difference between the erase voltage and the adjusted erase control voltage is greater than a voltage difference between the erase voltage and the erase control voltage; and
   performing a second erase operation based on the adjusted erase control voltage.

2. The method of claim 1, further comprising:
   increasing the erase voltage and the erase control voltage by an identical voltage level, in response to determining that the slow erase cells are not present.

3. The method of claim 1, wherein the adjusting of the erase control voltage comprises:
   reducing the erase control voltage while maintaining the erase voltage.

4. The method of claim 1, wherein the adjusting of the erase control voltage comprises:
   reducing the erase control voltage while increasing the erase voltage.

5. The method of claim 1, wherein the determining whether there are slow erase cells comprises:
   performing a first erase verify operation based on the first verify voltage;
   determining whether the erasing is associated with an erase pass or an erase fail based on the first erase verify operation;
   performing, in response to the erase fail, a second erase verify operation based on the second verify voltage; and
   determining whether the slow erase cells are present based on the second erase verify operation.

6. The method of claim 5, wherein the determining whether the slow erase cells are present comprises:
   determining that the slow erase cells are present, in response to a number of second fail bits associated with the second erase verify operation being greater than or equal to a reference number.

7. The method of claim 5, wherein the determining whether there are slow erase cells comprises:
   determining that the slow erase cells are present, in response to a ratio of a number of second fail bits associated with the second erase verify operation to a number of first fail bits associated with the first erase verify operation being equal to or greater than a reference ratio.

8. The method of claim 5, wherein the determining whether the erasing is associated with the erase pass or the erase fail comprises:
   determining a first erase fail when a number of first fail bits associated with the first erase verify operation is greater than or equal to a first reference number,
   determining a second erase fail when the number of the first fail bits is greater than or equal to a second reference number, the second reference number being less than the first reference number, and the method further comprises:
   increasing the erase voltage and the erase control voltage by an identical voltage level, in response to the first erase fail; and
   performing the second erase verify operation based on the second verify voltage, in response to the second erase fail.

9. The method of claim 5, wherein the adjusting of the erase control voltage comprises:
   reducing the erase control voltage while maintaining the erase voltage, in response to a number of second erase fail bits associated with the second erase verify operation being less than a third reference number, and
   increasing the erase voltage and reducing the erase control voltage, in response to the number of second erase fail bits being greater than or equal to the third reference number.

10. The method of claim 1, further comprising:
    storing, in a storage region, an indication of whether the slow erase cells are present;
    performing a write operation on the plurality of memory cells; and
    determining whether to perform the multiple erase verify operation based on the indication stored in the storage region.

11. The method of claim 1, wherein the selection transistors include a ground selection transistor and a string selection transistor, and
    the performing the first erase operation and the second erase operation include applying the erase voltage to drain electrodes of each of the ground selection transistor and the string selection transistor, and applying a respective one of the erase control voltage and the adjusted erase control voltage to gate electrodes of each of the ground selection transistor and the string selection transistor.

12. The method of claim 1, wherein the selection transistors include a ground selection transistor and a string selection transistor, and the performing the first erase operation and the second erase operation include applying the erase voltage to a drain electrode of the string selection transistor, and applying a respective one of the erase control voltage and the adjusted erase control voltage to a gate electrode of the string selection transistor.

13. The method of claim 1, wherein the first erase operation and the second erase operation are performed based on a leakage current generated from the first electrode due to a voltage difference between the first electrode and the second electrode of the at least one of the selection transistors.

14. The method of claim 1, wherein the non-volatile memory device includes a memory block in which the plurality of memory cells and the selection transistors are stacked in a direction perpendicular to a substrate.

15. A method of erasing a non-volatile memory device, the non-volatile memory device including a plurality of cell strings having memory cells and selection transistors connected together, the method comprising:

performing a first erase operation based on an erase voltage and an erase control voltage, the erase voltage being applied to a first electrode of at least one of the selection transistors and the erase control voltage being applied to a second electrode of the at least one of the selection transistors;

detecting whether each of the plurality of cell strings are erase-passed or erase-failed by performing an erase verify operation based on a verify voltage;

adjusting the erase control voltage to generate an adjusted erase control voltage such that, when at least some of the plurality of cell strings are erase-passed, a voltage difference between the erase voltage and the adjusted erase control voltage is greater than a voltage difference between the erase voltage and the erase control voltage; and performing a second erase operation based on the adjusted erase control voltage.

16. The method of claim 15, wherein the performing the second erase operation comprises:

inhibiting erasing of the at least some of the cell strings that are erase-passed.

17. The method of claim 15, wherein the selection transistors include a ground selection transistor and a string selection transistor, and the performing the first erase operation and the second erase operation include applying the erase voltage to a drain electrode of each of the ground selection transistor and the string selection transistor, and applying a respective one of the erase control voltage and the adjusted erase control voltage to a gate electrode of each of the ground selection transistor and the string selection transistor.

18. The erasing method of claim 17, wherein, the performing the second erase operation comprises:

applying the erase voltage to a drain electrode of the string selection transistor;

applying the adjusted erase control voltage to a gate electrode of the string selection transistor; and setting a drain electrode and a gate electrode of the ground selection transistor to a floated state.

19. A non-volatile memory device comprising:

a memory block including a plurality of cell strings, each cell string including memory cells and a selection transistor stacked in a direction perpendicular to a substrate, the selection transistor including a first electrode and a second electrode; and a control logic configured to, determine whether slow erase cells are present among the memory cells based on a result of verification according to multiple sensing based on a first verify voltage and a second verify voltage when performing an erase-verify iteration on the memory block, and adjust, in response to determining that the slow erase cells are present, an erase control voltage to generate an adjusted erase control voltage such that a voltage difference between an erase voltage provided to the first electrode and the adjusted erase control voltage provided to the second electrode is greater than a voltage difference between the erase voltage and the erase control voltage.

20. The non-volatile memory device of claim 19, wherein the control logic is configured to increase the erase voltage and the erase control voltage by an identical voltage level in response to determining that the slow erase cells are not present.

* * * * *